(12) United States Patent
Sorada et al.

(10) Patent No.: US 8,900,965 B2
(45) Date of Patent: Dec. 2, 2014

(54) NONVOLATILE MEMORY DEVICE MANUFACTURING METHOD

(75) Inventors: Haruyuki Sorada, Okayama (JP); Takumi Mikawa, Shiga (JP); Kenji Tominaga, Kyoto (JP); Kiyotaka Tsuji, Osaka (JP)

(73) Assignee: Panasonic Corporation, Osaka (JP)

( * ) Notice: Subject to any disclaimer, the term of this patent is extended or adjusted under 35 U.S.C. 154(b) by 8 days.

(21) Appl. No.: 13/884,630

(22) PCT Filed: Mar. 21, 2012

(86) PCT No.: PCT/JP2012/001947
§ 371 (c)(1),
(2), (4) Date: May 10, 2013

(87) PCT Pub. No.: WO2012/127861
PCT Pub. Date: Sep. 27, 2012

(65) Prior Publication Data
US 2013/0224931 A1 Aug. 29, 2013

(30) Foreign Application Priority Data

Mar. 22, 2011 (JP) .................................. 2011-063417
Apr. 4, 2011 (JP) .................................. 2011-083179

(51) Int. Cl.
*H01L 45/00* (2006.01)
*H01L 27/24* (2006.01)
*H01L 27/10* (2006.01)

(52) U.S. Cl.
CPC ............ *H01L 45/16* (2013.01); *H01L 27/2409* (2013.01); *H01L 27/2463* (2013.01); *H01L 27/2418* (2013.01); *H01L 45/1683* (2013.01); *H01L 45/04* (2013.01); *H01L 27/101* (2013.01)

USPC ........................................ 438/382; 438/104

(58) Field of Classification Search
CPC ............ H01L 27/2409; H01L 27/2418; H01L 27/2427; H01L 27/2463; H01L 27/2472; H01L 45/1233; H01L 45/124
USPC .................................................. 438/104, 382
See application file for complete search history.

(56) References Cited

U.S. PATENT DOCUMENTS

| 7,423,281 B2 * | 9/2008 | Rohr ................................. 257/2 |
| 2007/0007566 A1 | 1/2007 | Ishimaru |
| 2010/0283026 A1 * | 11/2010 | Mikawa et al. ................... 257/2 |
| 2012/0097915 A1 | 4/2012 | Mikawa et al. |

FOREIGN PATENT DOCUMENTS

JP      2000-77409      3/2000

(Continued)

OTHER PUBLICATIONS

International Search Report issued May 1, 2012 in International (PCT) Application No. PCT/JP2012/001947.

*Primary Examiner* — Fernando L Toledo
*Assistant Examiner* — Bryan Junge
(74) *Attorney, Agent, or Firm* — Wenderoth, Lind & Ponack, LLP

(57) ABSTRACT

A method of manufacturing a nonvolatile memory device that is a variable resistance nonvolatile memory device, which has good consistency with a dual damascene process that is suitable for the formation of fine copper lines and which enables large capacity and high integration. This method includes: forming a variable resistance element, a contact hole and a line groove; and forming a current steering layer of a bidirectional diode element above interlayer insulating layers and a variable resistance layer to cover the line groove without covering a bottom surface of the contact hole.

12 Claims, 31 Drawing Sheets

(56) References Cited

FOREIGN PATENT DOCUMENTS

| JP | 2000-91425 | 3/2000 |
| JP | 2001-127153 | 5/2001 |
| JP | 2007-19178 | 2/2007 |
| WO | 2010/064340 | 6/2010 |

* cited by examiner (a)

(b)

(c)

(a)

(b)

Alignment direction

Alignment direction

NONVOLATILE MEMORY DEVICE MANUFACTURING METHOD

TECHNICAL FIELD

The present invention relates manufacturing methods of variable resistance nonvolatile memory devices using variable resistance elements whose resistance values change in response to applications of electric pulses and are retainable in a nonvolatile manner.

BACKGROUND ART

With recent advances in digital technology, electronic devices such as portable information devices and home information appliances have been developed to provide higher functionality. Development of further miniaturized and higher-speed semiconductor elements is progressing at a high pace as electronic devices continue to be developed with higher functionality. In particular, the use of large-capacity nonvolatile memories, typified by flash memory, is expanding at a rapid pace. Furthermore, variable resistance nonvolatile memory devices using variable resistance elements are being researched and developed as the next-generation of nonvolatile memory having the potential to replace flash memory. As defined herein, a variable resistance element refers to an element which possesses certain properties allowing a resistance value thereof to change reversibly in response to an electric signal, and which is further capable of storing information corresponding to a resistance value in a nonvolatile manner.

Crosspoint nonvolatile memory devices (crosspoint memory) have been proposed as an example of large-capacity nonvolatile memory which incorporates these variable resistance elements. For example, Patent Literature 1 (PTL 1) discloses a nonvolatile memory device which includes a variable resistance film as the storage unit and a diode element as the switching element.

CITATION LIST

Patent Literature

[PTL 1] WO 2010/64340

SUMMARY OF INVENTION

Technical Problem

However, a variable resistance nonvolatile memory device manufacturing method which has good consistency with a dual damascene process that is suitable for the formation of fine copper lines and which enables large capacity and high integration cannot be achieved with the nonvolatile memory device manufacturing method according to PTL 1.

The present invention aims to provide a method of manufacturing a variable resistance nonvolatile memory device which has good consistency with a dual damascene process that is suitable for the formation of fine copper lines and which enables large capacity and high integration.

Solution to Problem

In order to achieve the above-described object, the method of manufacturing a nonvolatile semiconductor memory device according to an aspect of the present invention is a method of manufacturing a variable resistance nonvolatile memory device, the method comprising: forming a plurality of first lines in a stripe pattern above a substrate; forming a first interlayer insulating layer above the first lines; forming a plurality of memory cell holes, each of which penetrates the first interlayer insulating layer and connects to one of the first lines; filling each of the memory cell holes with at least one electrode of a variable resistance element and a variable resistance layer of the variable resistance element; forming a second interlayer insulating layer above the first interlayer insulating layer, followed by forming a contact hole which penetrates the first interlayer insulating layer and the second interlayer insulating layer and connects to one of the first lines; forming a line groove which penetrates the second interlayer insulating layer and connects to the contact hole and the variable resistance element; forming a current steering layer of a bidirectional diode element above the first interlayer insulating layer, the second interlayer insulating layer, and the variable resistance layer to cover the line groove without covering a bottom surface of the contact hole; and forming (i) the bidirectional diode element which is connected to the variable resistance element and (ii) a contact plug for the contact hole by forming a second line inside the contact hole and the line groove, the second line including a lower layer which functions as an upper electrode of the bidirectional diode element and an upper layer comprising a line material.

Advantageous Effects of Invention

With the present invention, a method of manufacturing a variable resistance nonvolatile memory device which has good consistency with a dual damascene process that is suitable for the formation of fine copper lines and which enables large capacity and high integration can be achieved.

DESCRIPTION OF EMBODIMENTS

Underlying Knowledge Forming Basis of the Present Invention

The inventors have found the following problems with the nonvolatile memory device manufacturing method according to PTL 1 disclosed in the Background Art section.

Figure 25A:
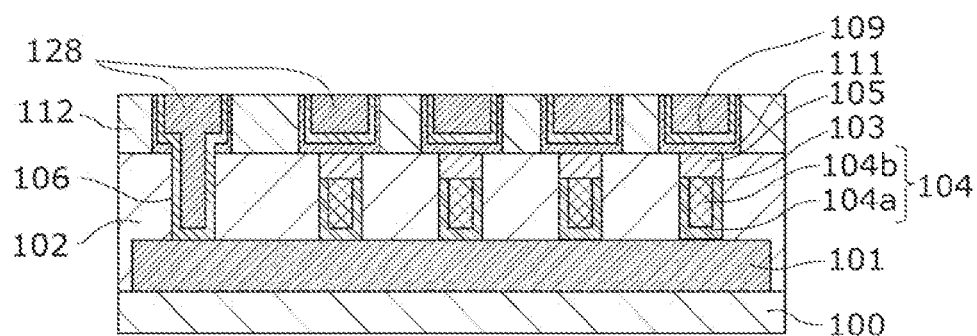
FIG. 25A is a cross-sectional view showing a variable resistance nonvolatile memory device that is prior art.
Figure 25B:
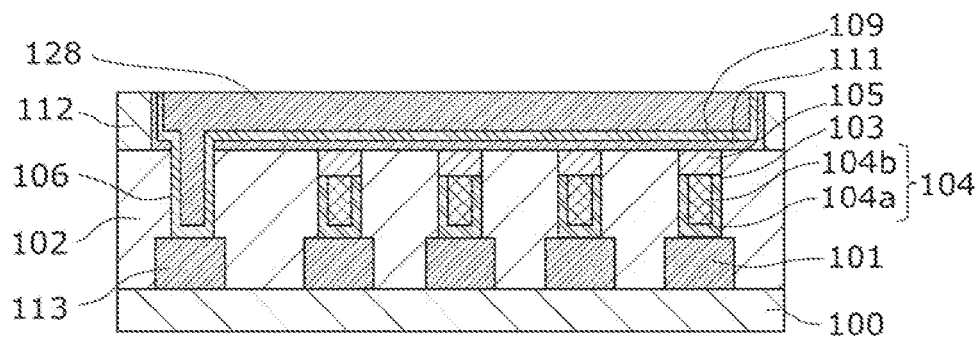
FIG. 25B is a cross-sectional view showing a variable resistance nonvolatile memory device that is prior art.
Figure 26:
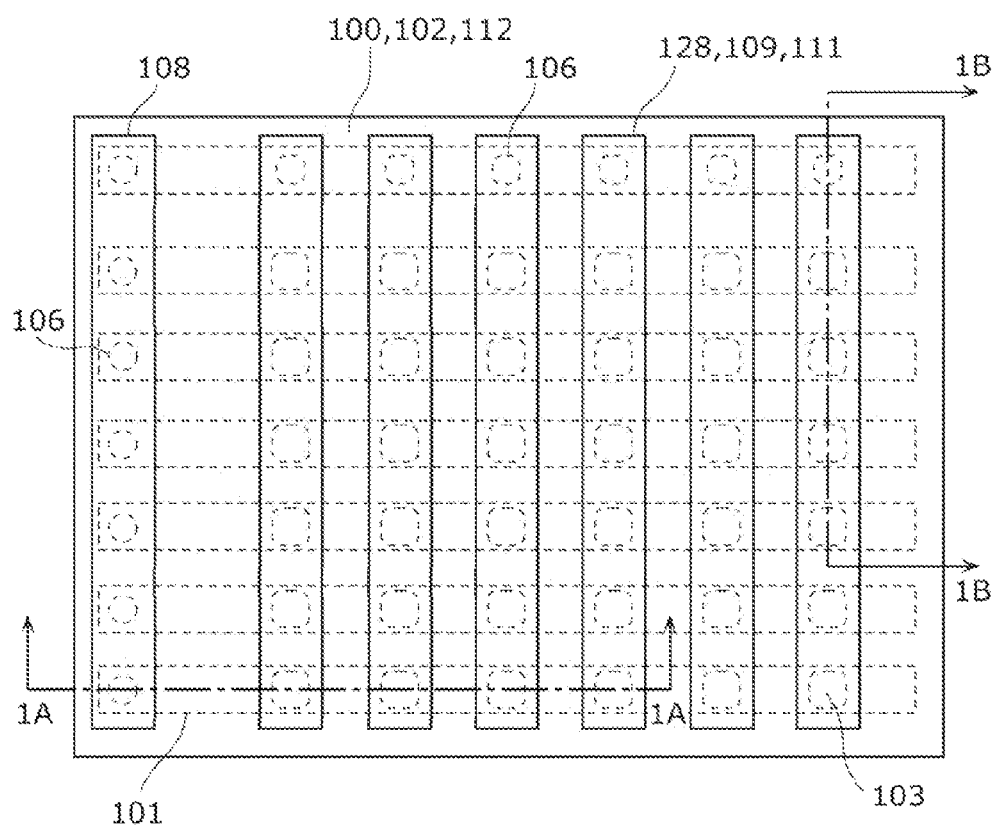
FIG. 26 is a plan view showing a variable resistance nonvolatile memory device that is prior art.

FIG. 25A and FIG. 25B are cross-sectional views showing an example configuration of a variable resistance nonvolatile memory device 40 according to PTL 1, and FIG. 26 is a plan view showing an example configuration of the variable resistance nonvolatile memory device. It is to be noted that FIG. 25A is a cross-sectional view at the single dotted-and-dashed line labeled 1A in FIG. 26 as viewed in the direction of the arrows, and FIG. 25B is a cross-sectional view at the single dotted-and-dashed line labeled 1B in FIG. 26 as viewed in the direction of the arrows.

As the plan view of FIG. 26 shows, a memory cell hole 103 is formed at each cross point of a plurality of first electrodes 101 formed parallel to each other in a stripe pattern and a plurality of third electrodes 109 formed parallel to each other in a stripe pattern.

As FIG. 25A and FIG. 25B show, the variable resistance nonvolatile memory device 40 according to PTL 1 includes a substrate 100 above which a first electrode 101 is formed, an interlayer insulating layer 102 comprising a silicon oxide film formed above the substrate 100 so as to cover the first electrode 101, a memory cell hole 103 penetrating the interlayer insulating layer 102 for electrical connection with the first electrode 101, and a contact hole 106. A first variable resistance layer 104a is formed on the side walls and bottom of the memory cell hole 103 so as to be in contact with the first electrode 101, and a second variable resistance layer 104b is formed thereabove and therewithin. A second electrode 105 is formed to fill a cavity formed on the surface of the interlayer insulating layer 102 above the memory cell hole 103 and covers the surfaces of the first variable resistance layer 104a and the second variable resistance layer 104b. Furthermore an interlayer insulating layer 112 comprising a silicon oxide film is formed between the lines on the interlayer insulating layer 102, a current steering layer 111 is formed on the bottom and side walls of a line groove formed in the interlayer insulating layer 112 between the lines, so as to cover the surface of the second electrode 105, and a third electrode 109 is formed to cover at least the surface of the current steering layer 111 above the second electrode 105.

A lead-out line 128 comprising copper is formed in the contact hole 106 formed in the interlayer insulating layer 102 as an adhesion layer for the third electrode 109. The lead-out line 128 is formed as a both a line and contact plug, and formed to extend above the memory cell hole 103. The variable resistance element includes the first electrode 101, a first variable resistance layer 104a, a second variable resistance layer 104b, and the second electrode 105. The diode element includes the second electrode 105, the current steering layer 111, and the third electrode 109.

As FIG. 26 shows, when the above-described variable resistance nonvolatile memory device 40 is seen in a plan view, the lower layer line layer formed in a stripe pattern and including the first electrode 101 and the upper layer line layer formed in a stripe pattern and including the third electrode 109, the current steering layer 111, and the lead-out line 128 are orthogonal to each other. The variable resistance element and the diode element are formed at a cross-point of the orthogonal lines via the memory cell hole 103. Moreover, the first electrode 101 is connected to the lead-out line 128 via the contact hole 106. This forms a cross-point memory array.

With this configuration, in addition to filling the bottom of the memory cell hole 103 with the variable resistance element, it is possible to form the bidirectional diode element, which is configured of the second electrode 105, the third electrode 109, and the current steering layer 111 interposed therebetween, above the memory cell hole 103. As a result, it is possible to realize a variable resistance nonvolatile memory device which enables large capacity and high integration without the provision of a switching element such as a transistor.

Here, in the diode element, tantalum nitride is used for the second electrode 105 and the third electrode 109, and a nitrogen-deficient silicon nitride film is used for the current steering layer 111. Since the tantalum nitride has a work function of 4.76 eV, which is sufficiently higher than the silicon electron affinity of 3.78 eV, a Schottky barrier forms at the interface of the second electrode 105 and the current steering layer 111 as well as at the interface of the third electrode 109 and the current steering layer 111, making it possible to realize a metal-semiconductor-metal (MSM) diode element. Additionally, the second electrode 105 comprising tantalum nitride tends not to cause a change in resistance in the variable resistance element since it has a lower standard electrode potential than that of the first electrode 101, so a change in resistance selectively occurs in the vicinity of the interface between the first electrode 101 and the first variable resistance layer 104a. Moreover, the second electrode 105 comprising tantalum nitride is characterized in that its adhesiveness with the lead-out line 128 comprising copper is good.

Figure 27:
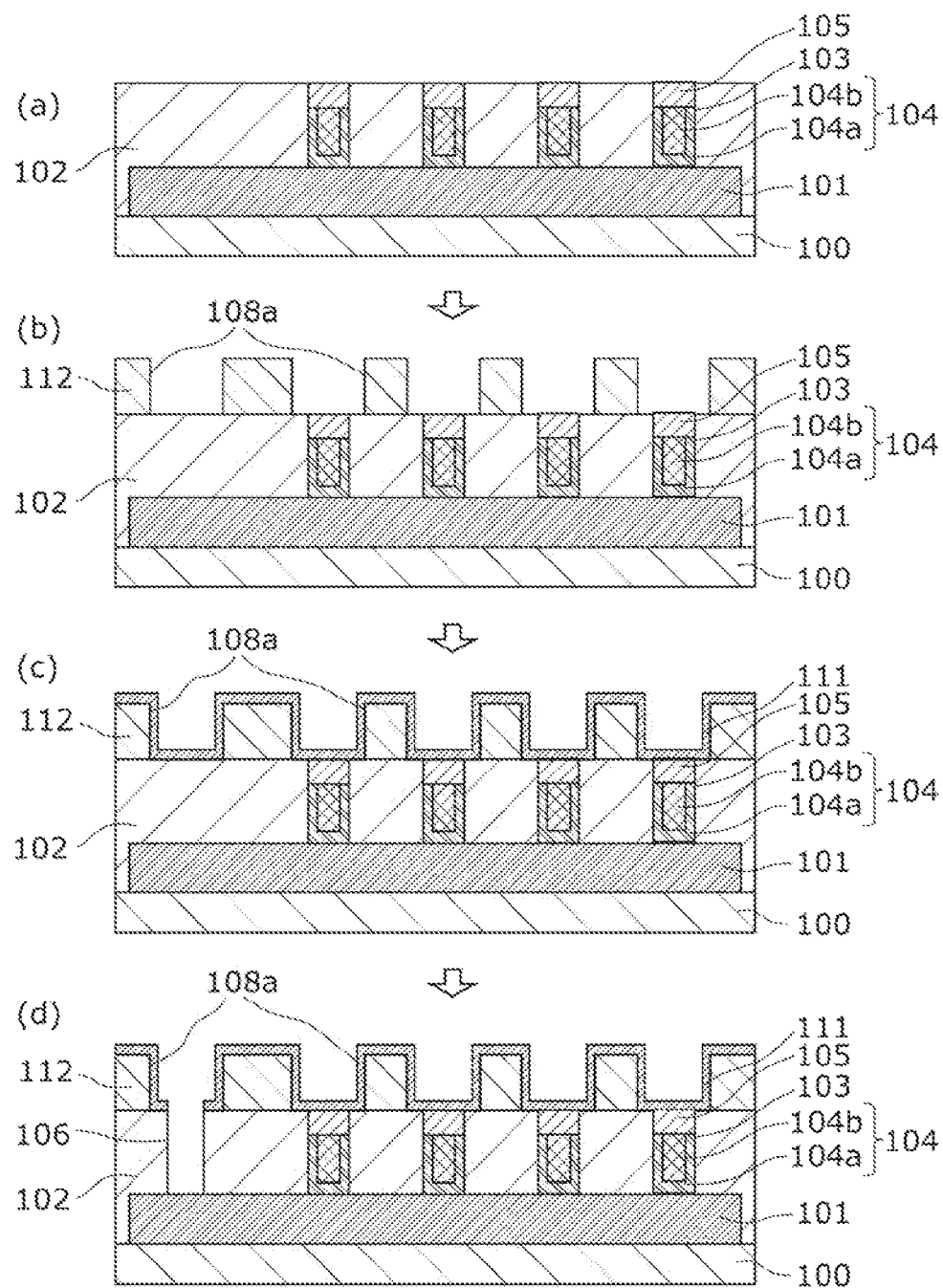
FIG. 27 is a cross-sectional view showing the main processes of a method for manufacturing a variable resistance nonvolatile memory device that is prior art.

However, the manufacturing method according to PTL 1 is different from the dual damascene process which is a mainstream fine copper lines process, and has the following problems. FIG. 27 (a) through (d) and FIG. 28 (a) through (c) are cross-sectional views showing the main manufacturing processes of the variable resistance nonvolatile memory device 40 according to PTL 1. The manufacturing method will be discussed using each of these drawings.

Firstly, as FIG. 27 (a) shows, after the first electrode (an electrode which concurrently functions as a line) 101 is formed above the substrate 100, an interlayer insulating layer 102 is formed on the first electrode 101. Next, a memory cell hole 103 is formed in the interlayer insulating layer 102 reaching to the first electrode 101. After the first variable resistance layer 104a and the second variable resistance layer 104b having a lower oxygen content atomic percentage than the first variable resistance layer 104a are formed filling the memory cell hole 103, the upper portions of the first variable resistance layer 104a and the second variable resistance layer 104b formed in the memory cell hole 103 are removed. A second electrode 105 comprising tantalum nitride is formed inside the memory cell hole 103 by covering, with tantalum nitride, all of the surfaces of the inside of the cavity formed in the upper part of the memory cell hole 103 after the removal process, and removing the excess tantalum nitride formed above the interlayer insulating layer using chemical mechanical polishing (CMP).

Next, as FIG. 27 (b) shows, the interlayer insulating layer 112 comprising a silicon oxide film and such is formed on the interlayer insulating layer 102, and the interlayer insulating layer 102 is patterned with a desired mask to form the line groove 108a to be later filled with the lead-out lines 128 and such. At this time, the upper surface of the second electrode 105 is exposed to the bottom of the line groove 108a.

Next, as FIG. 27 (c) shows, the current steering layer 111 comprising a nitrogen-deficient silicon nitride film and such is formed on the entire surface, including on the interlayer insulating layer 102 and on the line groove 108a in which the second electrode 105 is exposed.

Next, as FIG. 27 (d) shows, the contact hole 106, an opening which penetrates the interlayer insulating layer 102 and the current steering layer 111 formed in the line groove 108a and connects to the first electrode 101, is formed.

Figure 28:
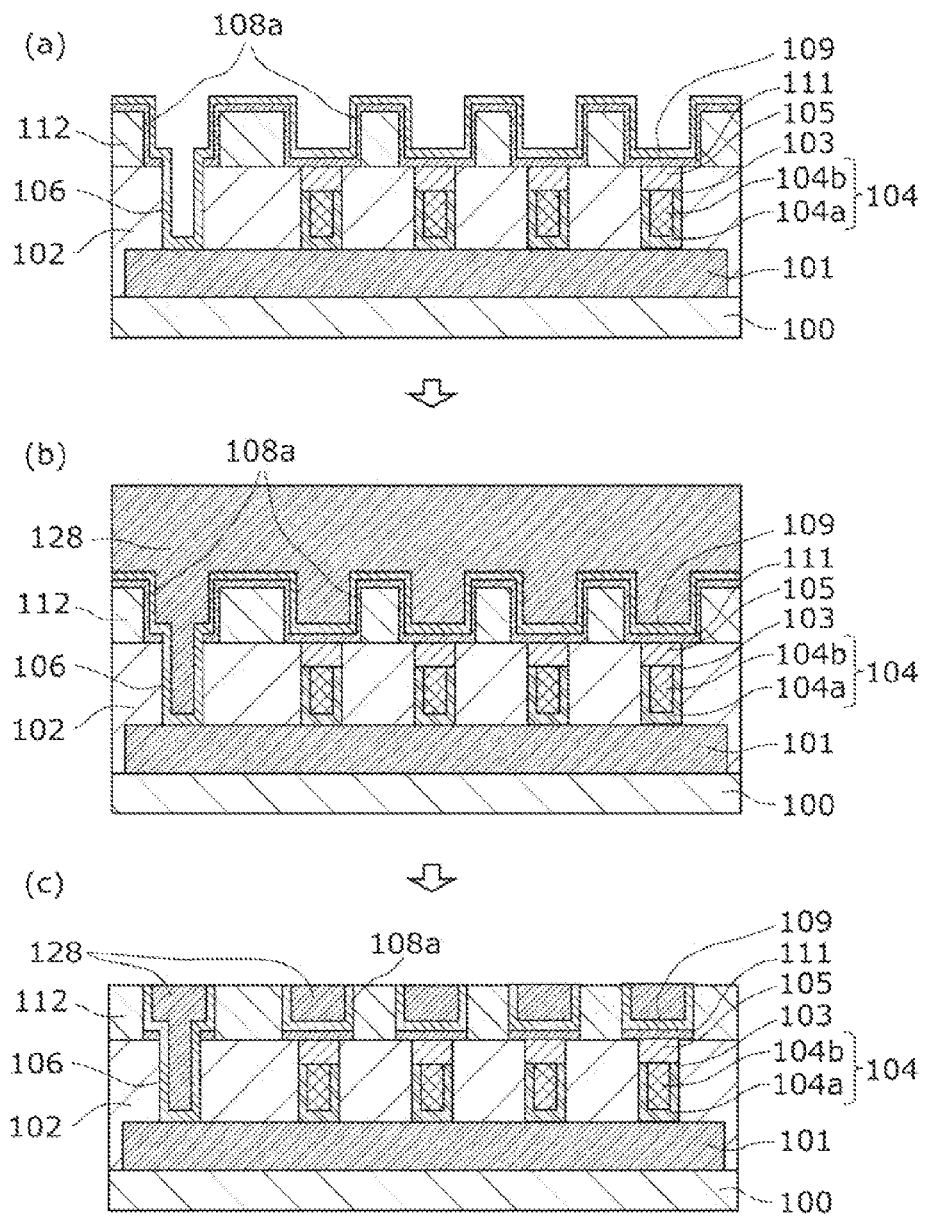
FIG. 28 is a cross-sectional view showing the main processes of a method for manufacturing a variable resistance nonvolatile memory device that is prior art.

Next, as FIG. 28 (a) shows, a third electrode 109 comprising tantalum nitride and such is formed to cover the entire surfaces of (i) the current steering layer 111 formed on the line groove 108a and the interlayer insulating layer 112, and (ii) the inner surfaces of the contact hole 106.

Next, as FIG. 28 (b) shows, the lead-out line 128 comprising copper and such is formed to cover the entire surface of the third electrode 109 formed above the line groove 108a, the interlayer insulating layer 112, and the contact hole 106.

Lastly, as FIG. 28 (c) shows, excess copper, tantalum nitride, and nitrogen-deficient silicon nitride film formed above the interlayer insulating layer 112 is removed by CMP so that the current steering layer 111 comprising nitrogen-deficient silicon nitride film and such, the third electrode 109 comprising tantalum nitride and such, and the lead-out line 128 are only formed in the line groove 108a. Moreover, the third electrode 109 comprising tantalum nitride which acts as an adhesion layer and the lead-out line 128 are formed inside the contact hole 106.

With the manufacturing processes according to PTL 1, as previously explained, in order to connect the materials within the memory cell hole 103 and the MSM diode element forming the cross point memory, it is necessary to form the current steering layer 111 below the conventional line structure. As such, it is necessary to form the line groove 108a first before the contact hole 106, meaning the conventional dual damascene processes cannot be used. As a result, the contact hole 106 is opened is in the surface of the multilevel wafer having a deep line groove 108a (FIG. 27 (d)) only after the line groove 108a is formed and the current steering layer 111 is formed inside the line groove 108a (FIG. 27 (b)).

With this sort of prior art manufacturing process order, it is possible to completely remove the current steering layer 111 from above the opening of the contact hole 106 at the same time as the opening of the contact hole 106 is formed. As such, a portion of the surface of the first electrode 101 becomes exposed to the bottom of the contact hole 106, and a union having a good ohmic characteristics is formed between the third electrode 109 formed in the contact hole 106 and the first electrode 101.

However, with this sort of prior art manufacturing process order, in the lithography process in which the contact hole 106 is formed, since the line groove 108a is formed at the position at which the contact hole 106 is to be formed, the position at which the contact hole 106 is to be formed is lower than the surface of the interlayer insulating layer 102 by the height of the line groove 108a. Generally, in resist coating by spin coat, the larger the gap of a multilevel groove the thinner the resist film coated on the groove tends to be, and regional variations in resist film thickness form in accordance with the pattern of the line groove 108a. These variations in resist film thickness lead to making variations in exposure settings in the lithography process, leading to inconsistencies in the dimensions of the opening of the contact hole 106. As such, it becomes difficult to accurately form the minute dimensions of the contact hole 106 in the surface of the wafer. Consequently, while the dimension inconsistencies in the opening of the contact hole 106 stand up where design rules allow them, there is a problem with the prior art manufacturing process order in that it is difficult to apply in cases of miniaturization.

Hereinafter in the present invention, the phrase outside of the focus margin is used to describe unacceptable inconsistencies in exposure as a result of variations in exposure settings in the lithography processes to accommodate for variations in the resist film.

On the other hand, with the conventional line manufacturing process—the dual damascene process—there is nearly no impact on the focus margin in the lithography process of the contact hole 106 since the contact hole 106 is formed in the surface of the planar wafer first. Furthermore, in the subsequent lithography process for forming the line groove 108a as well, since the surface area of the opening of the contact hole 106 is small, regional variations in resist film thickness can be made to be extremely small compared to the contact hole 106 of the prior art, so small that they pose no problem with regard to impact on focus margin and processing.

In order to solve the above-described problem, the method of manufacturing a nonvolatile semiconductor memory device according to an aspect of the present invention is a method of manufacturing a variable resistance nonvolatile memory device, the method comprising: forming a plurality of first lines in a stripe pattern above a substrate; forming a first interlayer insulating layer above the first lines; forming a plurality of memory cell holes, each of which penetrates the first interlayer insulating layer and connects to one of the first lines; filling each of the memory cell holes with at least one electrode of a variable resistance element and a variable resistance layer of the variable resistance element; forming a second interlayer insulating layer above the first interlayer insulating layer, followed by forming a contact hole which penetrates the first interlayer insulating layer and the second interlayer insulating layer and connects to one of the first lines; forming a line groove which penetrates the second interlayer insulating layer and connects to the contact hole and the variable resistance element; forming a current steering layer of a bidirectional diode element above the first interlayer insulating layer, the second interlayer insulating layer, and the variable resistance layer to cover the line groove without covering a bottom surface of the contact hole; and forming (i) the bidirectional diode element which is connected to the variable resistance element and (ii) a contact plug for the contact hole by forming a second line inside the contact hole and the line groove, the second line including a lower layer which functions as an upper electrode of the bidirectional diode element and an upper layer comprising a line material.

Here, in the forming of a line groove, the line groove may be formed to connect to the memory cell holes aligned in the extending direction of the line groove.

With this aspect, the line groove can be formed subsequent to the formation of the contact hole, the focus margin can be secured in the lithography process for forming the contact hole, and the contact hole having minute dimensions can be accurately formed in the wafer surface. As a result, a method of manufacturing a variable resistance nonvolatile memory device which has good consistency with a dual damascene process that is suitable for the formation of fine copper lines can be achieved.

Moreover, the current steering layer of the bidirectional diode element is formed inside the line groove so as to cover the opening of the memory cell hole, but selectively formed so as not to be formed on the bottom surface of the contact hole. With this, the first line and the contact hole are connected via a barrier film having good adhesive properties and not the current steering layer of the bidirectional diode element. As a result, the contact resistance between the first line and the contact plug can be kept low, and at the same time, the bidirectional diode element can be formed in the line groove above the memory cell hole. Consequently, it is possible to realize a variable resistance nonvolatile memory device which enables large capacity and high integration.

Moreover, since the current steering layer of the bidirectional diode element can be formed selectively, a separate etching process for removing the current steering layer of the bidirectional diode can be omitted, thereby decreasing the number of manufacturing processes. As a result, it is possible to provide a variable resistance nonvolatile memory device at low cost.

Here, when: a is a size of an opening of the contact hole in the extending direction; e is a distance in the extending direction from an end of an opening of the line groove to an end of an opening of a closest one of the memory cell holes that is closest to the end of the opening of the line groove; c is a height of the contact hole; and d is a height of the line groove, the a and the e are values measured in a same direction and cross section for (i) the contact hole and the memory cell holes that are aligned in the extending direction and (ii) the line groove which includes openings of the contact hole and the memory cell holes, and using the a, the c, the d, and the e, $\alpha$ is defined by $\alpha=\tan^{-1}$ (c/a) and $\gamma$ is defined by $\gamma=\tan^{-1}$ (d/e), the line groove, the contact hole, and all of the memory cell holes may be formed to satisfy $\alpha > \gamma$.

Moreover, a sputtering direction of the deposit material may have an angle $\theta$ relative to the surface of the substrate and may be a direction that is parallel to the cross section in which the a and the e are measured, and the angle $\theta$, the $\alpha$, and the $\gamma$ may satisfy $\gamma < \theta < \alpha$.

With this, the material of the current steering layer of the bidirectional diode element will not reach the bottom surface of the contact hole. Consequently, it is possible to make it so that the current steering layer of the bidirectional diode element is not formed on the bottom surface of the contact hole.

Moreover, when the contact hole is positioned in the extending direction between one of the memory cell holes closest to the end of the opening of the line groove and the end of the opening of the line groove, b is a distance from an end of the opening of the contact hole furthest from the end of the opening of the line groove to the end of the opening of the line groove, the a and the b are values measured in the same direction and cross section for (i) the contact hole and the memory cell holes that are aligned in the extending direction and (ii) the line groove which includes openings of the contact hole and the memory cell holes, and using the b, the c, and the d, $\beta$ is defined by $\beta=\tan^{-1}$ {(c+d)/b}, the line groove and the contact hole may be formed to satisfy $\beta > \alpha$.

Moreover, a sputtering direction of the deposit material may have an angle $\theta$ relative to the surface of the substrate, may be a direction that is parallel to the cross section in which the a, the b, and the e are measured, and may be a direction from the end of the opening of the line groove toward the contact hole, and the angle $\theta$, the $\alpha$, and the $\gamma$ may satisfy $\gamma < \theta < \beta$.

With this, it is possible to form the angle $\theta$ to be even larger, increase the film forming rate for forming the current steering layer of the MSM diode element, and furthermore possible to increase the film thickness controllability.

Moreover, the forming of a current steering layer may include: forming a current steering layer of a bidirectional diode element above the first interlayer insulating layer, the second interlayer insulating layer, and the variable resistance layer to cover the contact hole and the line groove; and exposing the first lines by removing the current steering layer from inside the contact hole and from inside the line groove above the contact hole while leaving a portion of the current steering layer that is above the variable resistance layer, wherein in the forming of a bidirectional diode element and a contact plug for the contact hole, the second line may be formed in the contact hole, in the line groove above the contact hole, and in the line groove above the variable resistance layer.

With this aspect, the line groove can be formed subsequent to the formation of the contact hole, the focus margin can be secured in the lithography process for forming the contact hole, and the contact hole having minute dimensions can be accurately formed in the wafer surface. As a result, a method of manufacturing a variable resistance nonvolatile memory device which has good consistency with a dual damascene process that is suitable for the formation of fine copper lines can be achieved.

Moreover, regarding the current steering layer of the bidirectional diode formed in the contact hole and the line groove, the portion inside the contact hole can be selectively removed while the portion inside the line groove is left to remain. With this, the first line and the contact plug inside the contact hole are in contact via a barrier film having good adhesive properties and not the current steering layer of the bidirectional diode element. As a result, the contact resistance between the first line and the contact plug can be kept low, and at the same time, the bidirectional diode can be formed in the line groove. Consequently, it is possible to realize a variable resistance nonvolatile memory device which enables large capacity and high integration.

Hereinafter, embodiments of the present invention are described with reference to the Drawings.

It is to be noted that in the Drawings, elements having the same essential configuration, function, and effect share the same reference numerals. Moreover, all values disclosed herein are examples for the purpose of describing the present invention in detail, and therefore do not limit the scope of the present invention. Furthermore, the materials, structural elements, arrangements and relation of connection of structural elements, steps, and step order and such shown in the following embodiments are mere examples for the purpose of explaining the present invention in detail, and therefore do not limit the scope of the present invention. Moreover, in the drawings, the constituents are schematically depicted for easier understanding. Therefore, the shapes and scales of the constituents are not depicted accurately. In addition, the number of elements depicted is determined with ease of understanding in mind. Moreover, among the structural elements in the following exemplary embodiments, structural elements not recited in any one of the independent claims defining the most generic part of the inventive concept are described as structural elements of a preferable embodiment.

First Embodiment

Figure 1A:
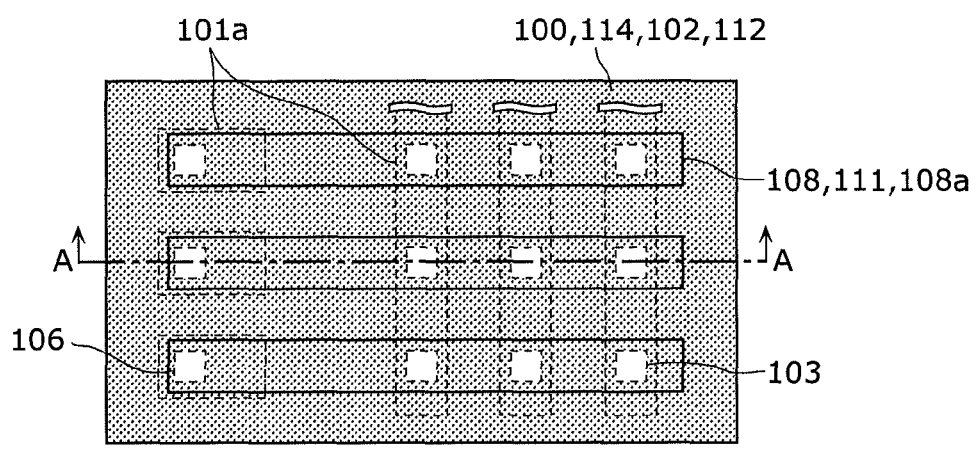
FIG. 1A is a plan view showing the variable resistance nonvolatile memory device according to the first embodiment of the present invention.
Figure 1B:
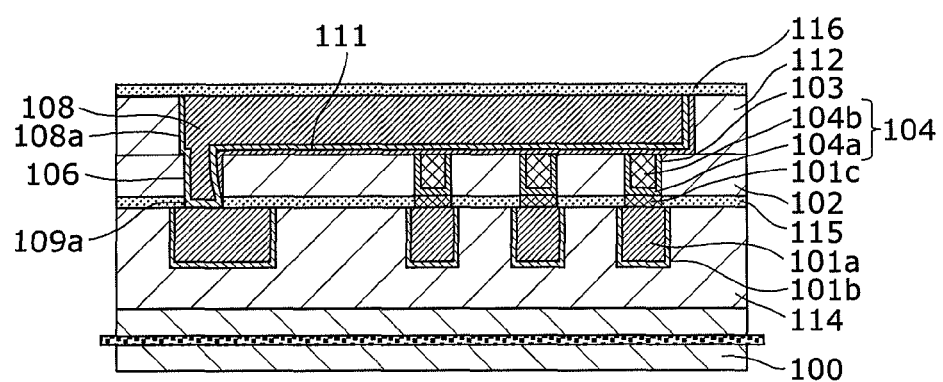
FIG. 1B is a cross-sectional view showing the variable resistance nonvolatile memory device according to the first embodiment of the present invention.

FIG. 1A is a plan view showing an example of a configuration of the variable resistance nonvolatile memory device according to the first embodiment of the present invention. FIG. 1B is a cross-sectional view showing an example of a configuration of the variable resistance nonvolatile memory device according to the first embodiment of the present invention. It is to be noted that FIG. 1B is a cross-sectional view at the single dotted-and-dashed line labeled A in FIG. 1A as viewed in the direction of the arrows.

The configuration of this nonvolatile memory device (cross-point memory) is nearly the same as the cross-sectional view of the prior art shown in FIG. 25A and FIG. 25B and plan view shown in FIG. 26. The elements shown in FIG. 1A and FIG. 1B share the same reference numerals as the elements shown in FIG. 25A, FIG. 25B, and FIG. 26 having essentially the same functions. The first embodiment is different from the prior art example in that the first electrode 101 disclosed in the prior art example is provided on a first line 101a as a first electrode 101c in the first embodiment. Moreover, in the prior art example, the second electrode 105 is provided separate from the second variable resistance layer 104b as a lower electrode of the MSM diode element. However, in the first embodiment, the second variable resistance layer 104b also performs as the lower electrode of the MSM diode element. Furthermore, the first embodiment is different in that it includes a liner film 115 and 116 for preventing oxidation of the copper lines.

The plan view FIG. 1A shows the first lines 101a including a plurality of cross-point array lines aligned parallel to each other in a stripe pattern and lines for connecting the cross-point array lines to the surrounding circuit, and the second lines (lead-out lines) 108 including a plurality of cross-point array lines aligned parallel to each other in a stripe pattern and lines for connecting the cross-point array lines to the surrounding circuit. The memory cell hole 103 is formed at the cross point of the cross-point array line of the first line 101a and the cross-point array line of the second line 108. A plurality of the line grooves 108a are formed and the plurality of line grooves 108a extend in the same direction.

Figure 2:
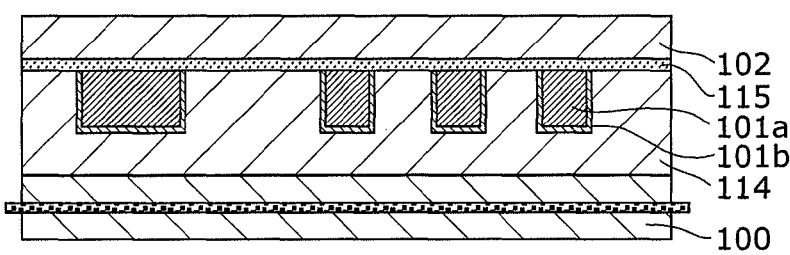
FIG. 2 is a cross-sectional view showing the main processes of the variable resistance nonvolatile memory device manufacturing method according to the first embodiment of the present invention.
Figure 2:
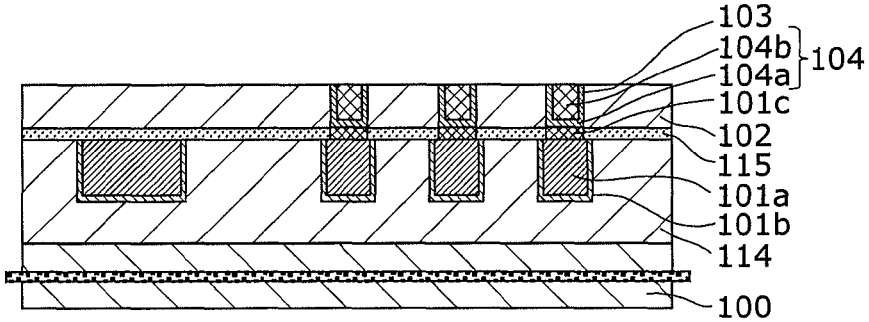
Figure 2:
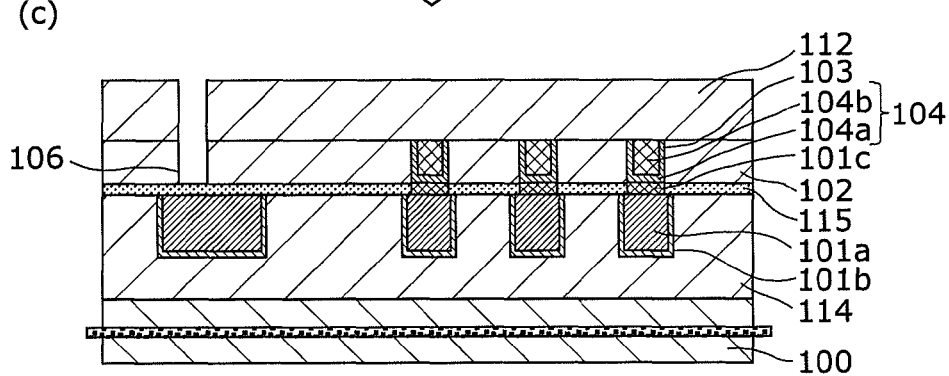
Figure 3:
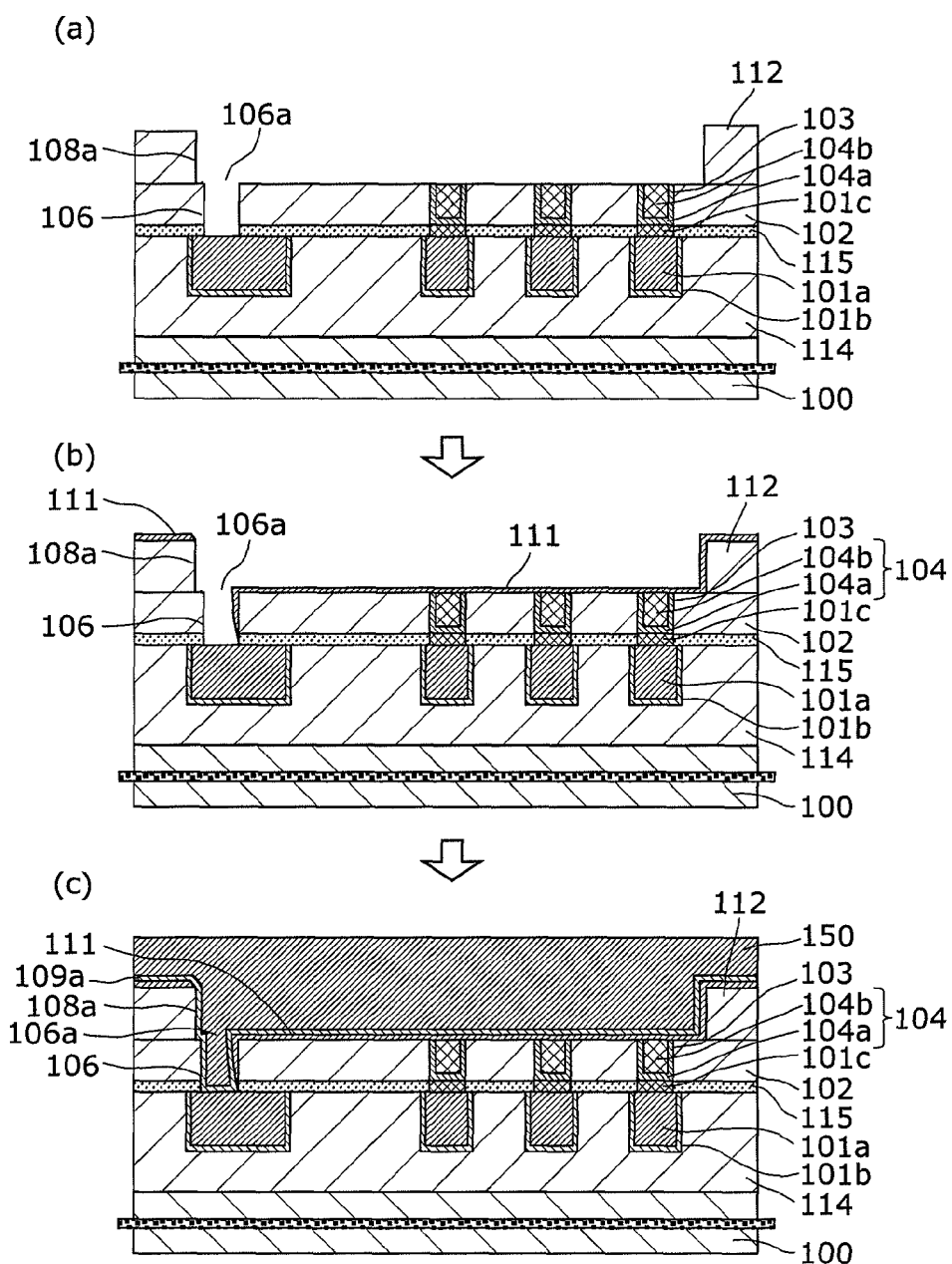
FIG. 3 is a cross-sectional view showing the main processes of the variable resistance nonvolatile memory device manufacturing method according to the first embodiment of the present invention.
Figure 4:
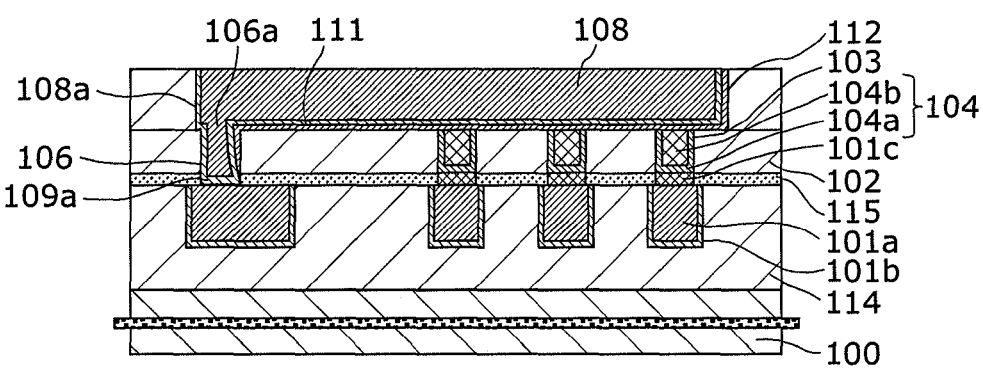
FIG. 4 is a cross-sectional view showing the main processes of the variable resistance nonvolatile memory device manufacturing method according to the first embodiment of the present invention.
Figure 4:
Figure 4:
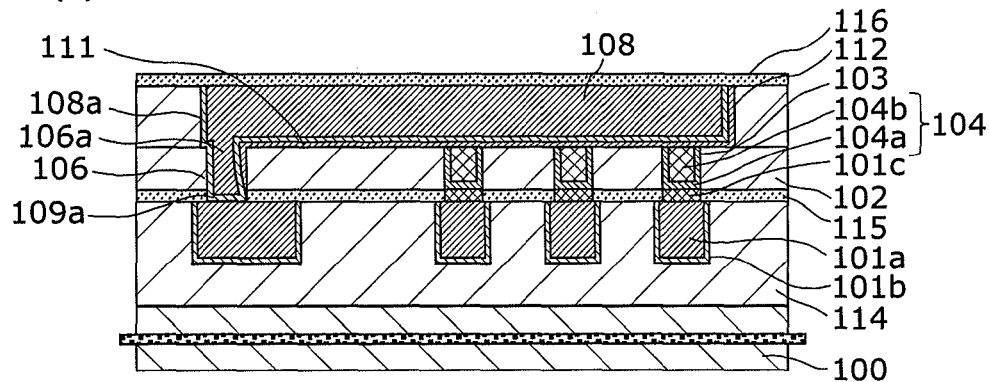

FIG. 2 (a) through (c), FIG. 3 (a) through (c), and FIG. 4 (a) and (b) are cross-sectional views showing the main processes of the variable resistance nonvolatile memory device manufacturing method according to the first embodiment. The manufacturing method is described using each of these drawings.

First, FIG. 2 (a) shows the process for forming the first line 101a and the interlayer insulating layers 102 and 114. In this process, firstly, the interlayer insulating layer 114 comprising a silicon oxide film (for example, a plasma tetra ethyl ortho silicate (TEOS) film or a fluorinated silicate glass (FSG) film) is formed by, for example, plasma chemical vapor deposition (CVD) above the substrate 100 on which transistors and lower layer lines and such are formed. Next, the line groove to be filled with the first line 101a is formed in the interlayer insulating layer 114 by photolithography and dry etching. Next, the barrier film 101b comprising TaN (film thickness: no less than 5 nm and no more than 40 nm) and Ta (film thickness: no less than 5 nm and no more than 40 nm), and copper line material (film thickness: no less than 50 nm and no more than 300 nm) are successively deposited in the formed line groove by, for example, sputtering. The barrier film 101b improves the adhesiveness of the interlayer insulating layer 114 comprising a silicon oxide film and such and the first line 101a comprising copper, and inhibits the diffusion of the copper of the first line 101a in the interlayer insulating layer 114. The first lines 101a are formed in a stripe pattern above the substrate 100 by filling all of the line grooves with the copper line material by further depositing copper with an electrolytic plating method using the deposited copper as the seed. Furthermore, a chemical mechanical polishing (CMP) process is used to remove excess copper from and planarize (make flush) the surfaces of the interlayer insulating layer 114 and the first line 101a. Next, a SiN film having a thickness of approximately no less than 30 nm and no more than 200 nm is deposited by, for example, plasma CVD to cover the copper first line 101a, thereby forming the liner film 115. The interlayer insulating layer 102 is then further deposited on the liner film 115 (plurality of first lines 101a) as the first interlayer insulating layer, and if necessary, the surface of the interlayer insulating layer 102 is leveled by CMP.

FIG. 2 (b) shows the process for forming the memory cell hole which penetrates the interlayer insulating layer 102 to connect to the first line 101a. In this process, firstly, an opening, which is the memory cell hole 103, is formed which penetrates the interlayer insulating layer 102 and the liner film 115 and connects to the first line 101a. Next, the first electrode 101c comprising a noble metal and such is selectively formed only on the copper first line 101a on the bottom of the memory cell hole 103 by, for example, electroless plating. For example, Pt, Ir, and Pd and the like are grown to be no less than 2 nm and no more than 30 nm. Here, Pt is grown to be about 5 nm. At this time, a foundation plating layer comprising Ni and such may be grown between the copper and the noble metal. In this case, compared to when the foundation of the first electrode 101c is copper, the electroless plating is easier to control. Next, the first variable resistance layer 104a comprising tantalum oxide and such is formed by sputtering a tantalum target in a mixed gas atmosphere of argon and oxygen, in other words, by a reactive sputtering method, on the first electrode 101c on the bottom of the memory cell hole 103, on the side walls of the memory cell hole 103, and on the surface of the interlayer insulating layer 102. When using reactive sputtering, oxygen content atomic percentage can be increased by increasing the flow rate of oxygen at the time of deposition. Here, sputtering is performed at a power of 1.6 kW while flowing argon gas at 34 sccm and oxygen gas at 24 sccm to form the first variable resistance layer 104a having an oxygen content atomic percentage of approximately 71 atm %. Next, tantalum oxide for the second variable resistance layer 104b having a lower oxygen content atomic percentage than that of the first variable resistance layer 104a is formed inside the memory cell hole 103 on the surface of which the first variable resistance layer 104a is formed, that is to say, formed above the first variable resistance layer 104a formed inside the memory cell hole 103. This formation is performed by reactive sputtering at the same time the first variable resistance layer 104a is formed. Here, sputtering is performed at a power of 1.6 kW while flowing argon gas at 34 sccm and oxygen gas at 20.5 sccm to form the second variable resistance layer 104b having an oxygen content atomic percentage of approximately 60 atm %. In the formation of the second variable resistance layer 104b, sputtering is performed to deposit the tantalum oxide inside the memory cell hole 103 until the memory cell hole 103 is filled, then excess tantalum oxide above the surface of the interlayer insulating layer 102 is removed by CMP so that the first variable resistance layer 104a and the second variable resistance layer 104b are only formed in the memory cell hole 103. With this, at least one electrode of the variable resistance element and the variable resistance layer 104 fill the memory cell hole 103.

An oxygen-deficient transition metal oxide, for example, (preferably oxygen-deficient tantalum oxide) is used as a material for the variable resistance layer 104. An oxygen-deficient transition metal oxide is an oxide having a non-stoichiometric composition whose oxygen content (atomic ratio: ratio of number of oxygen atoms to total number of atoms) is less than an oxide having a stoichiometric composition. An oxide having a stoichiometric composition is usually an insulator or has an extremely high resistance value. For example, when the transition metal is Ta, the formula the stoichiometric oxide compound is $Ta_2O_5$ since the atomic ratio of O to Ta (O/Ta) is 2.5. As such, in the oxygen-deficient tantalum oxide, the atomic ratio of O to Ta is greater than 0 and less than 2.5. In the first embodiment, the oxygen-deficient transition metal oxide is preferably an oxygen-deficient tantalum oxide. It is even more preferable that the variable resistance layer 104 have at least a stacked structure including a second tantalum oxide layer having a composition expressed as $TaO_x$ ($0<x<2.5$) as the second variable resistance layer 104b and a first tantalum oxide layer having a composition expressed as $TaO_y$ ($x<y$) as the first variable resistance layer 104a. It goes without saying that other layers, such as a third layer containing tantalum or a layer comprising a different transition metal oxide, may also be deposited appropriately. Here, $TaO_x$ preferably satisfies $0.8 \le x \le 1.9$, and $TaO_y$ preferably satisfies 2.1≤y. The first tantalum oxide layer preferably has a thickness of no less than 1 nm and no more than 8 nm. In other words, the variable resistance layer 104 preferably has a stacked structure including the second tantalum oxide layer having a low oxygen content atomic percentage and the first tantalum oxide layer having a high oxygen content atomic percentage. In other words, the variable resistance layer 104 preferably has a stacked structure including the second tantalum oxide layer 104b having a high level of oxygen deficiency as the second variable resistance layer 104b and the first tantalum oxide layer 104a having a low level of oxygen deficiency as the first variable resistance layer 104a. Here, level of oxygen deficiency with respect to transition metal oxides refers to a ratio of oxygen deficiency to the amount of oxygen included in an oxide having a stoichiometric composition. For example, when the transition metal is tantalum (Ta), the composition is expressed as $TaO_{2.5}$ since the formula for the stoichiometric oxide compound, as defined above, is $Ta_2O_5$. The level of oxygen deficiency of $TaO_{2.5}$ is 0%, so the level of oxygen deficiency of the oxygen-deficient tantalum oxide $TaO_{1.5}$ is 40% ((2.5−1.5)/2.5=40%). For example, the oxygen content atomic percentage of $Ta_2O_5$ is 71.4 atm %, which is the ratio of the number of oxygen atoms to the total number of atoms (O/(Ta+O)). Thus, an oxygen-deficient tantalum oxide has an oxygen content atomic percentage that is greater than 0 and less than 71.4 atm %.

Here, a transition metal other than tantalum may be used as the metal included in the variable resistance layer 104. Tantalum (Ta), titanium (Ti), hafnium (Hf), zirconium (Zr), niobium (Nb), tungsten (W), etc., may be used as the transition metal. Since transition metals can assume many different oxidation states, it is possible to achieve different resistance states through oxidation-reduction reactions. For example, it has been confirmed that the resistance value of the variable resistance layer 104 can be changed at high-speed in a stable manner when hafnium oxide is used and the variable resistance layer 104 has a stacked structure including a first hafnium oxide layer and a second hafnium oxide layer, where the second hafnium oxide layer functioning as the second variable resistance layer 104b has a composition of $HfO_x$, where x is no less than 0.9 and no more than 1.6 and the first hafnium oxide layer functioning as the first variable resistance layer 104a has a composition of $HfO_y$, where y is greater than x. In this case, it is preferable that the first hafnium oxide layer have a thickness no less than 3 nm and no more than 4 nm.

Moreover, it has been confirmed that the resistance value of the variable resistance layer 104 can be changed at high-speed in a stable manner when zirconium oxide is used and the variable resistance layer 104 has a stacked structure including a first zirconium oxide layer and a second zirconium oxide layer, where the second zirconium oxide layer functioning as the second variable resistance layer 104b has a composition of $ZrO_x$ where x is no less than 0.9 and no more than 1.4 and the first zirconium oxide layer functioning as the first variable resistance layer 104a has a composition of $ZrO_y$, where y is greater than x. In this case, it is preferable that the first zirconium oxide layer have a thickness no less than 1 nm and no more than 5 nm.

When a stacked structure of hafnium oxide layers is used in the variable resistance layer, the first hafnium oxide layer is formed by exposing the surface of the hafnium oxide layer to a plasma of argon and oxygen gas after the hafnium oxide layer is formed above the first electrode 101c by reactive sputtering in argon gas and oxygen gas using a target of Hf. The second hafnium oxide layer is formed by performing the reactive sputtering described above once again on the first hafnium oxide layer. The oxygen content atomic percentage of the first hafnium oxide layer can easily be adjusted by changing the flow rate of oxygen gas to argon gas in the reactive sputtering, similar to the case with the tantalum oxide layer described above. It is to be noted that a substrate does not especially need to be heated; room temperature is acceptable.

Moreover, the film thickness of the first hafnium oxide layer and the film thickness of the hafnium oxide layer formed by reactive sputtering can easily be adjusted by changing the exposure time to the plasma of argon and oxygen gas.

When a stacked structure of zirconium oxide layers is used, the first zirconium oxide layer is formed by exposing the surface of the zirconium oxide layer to a plasma of argon and oxygen gas after the zirconium oxide layer is formed above the first electrode 101c by reactive sputtering in argon gas and oxygen gas using a target of Zr. The second zirconium oxide layer is formed by performing the reactive sputtering described above once again on the first zirconium oxide layer. The oxygen content atomic percentage of the first zirconium oxide layer can easily be adjusted by changing the flow rate of oxygen gas to argon gas in the reactive sputtering, similar to the case with the tantalum oxide layer described above. It is to be noted that a substrate does not especially need to be heated; room temperature is acceptable.

Moreover, the film thickness of the first zirconium oxide layer and the film thickness of the zirconium oxide layer formed by reactive sputtering can easily be adjusted by changing the exposure time to the plasma of argon and oxygen gas.

It is to be noted that when the variable resistance layer 104 includes a first transition metal oxide layer as the first variable resistance layer 104a and a second transition metal oxide layer as the second variable resistance layer 104b, the first transition metal included in the first transition metal oxide and the second transition metal included in the second transition metal oxide may be different transition metals. In this case, it is preferable that the first transition metal oxide layer have a lower level of oxygen deficiency than that of the second transition metal oxide layer. In other words, it is preferable that the first transition metal oxide layer have higher resistance than the second transition metal oxide layer. With such a configuration, the voltage applied between the first electrode 101c included in the variable resistance element and the other electrode during a resistance change is distributed to the first transition metal oxide layer in majority, thereby allowing the oxidation-reduction reactions to occur more easily in the first transition metal oxide layer. Moreover, when the first transition metal and the second transition metal are different materials, it is preferred that the standard electrode potential of the first transition metal be lower than the standard electrode potential of the second transition metal. This is because it is conceivable that the resistance changing phenomenon occurs as the resistance value changes when oxidation-reduction reactions occur in the fine filament (conductive path) formed inside the high-resistance first transition metal oxide layer. For example, by using oxygen-deficient tantalum oxide in the second transition metal oxide layer and titanium oxide ($TiO_2$) in the first transition metal oxide layer, a stable resistance changing operation can be achieved. Titanium (standard electrode potential=−1.63 eV) has a lower standard electrode potential than tantalum (standard electrode potential=−0.6 eV). The higher the standard electrode potential, the less a metal tends to oxidize. Oxidation-reduction reactions can be made to occur more easily in the second transition metal oxide layer by using a metal oxide having a lower standard electrode potential than the first transition metal oxide layer in the second transition metal oxide layer.

It is conceivable that the resistance changing phenomenon in the variable resistance layer 104 having the stacked structure of the above described materials occurs and the resistance value changes as oxidation-reduction reactions occur in the fine filament formed inside the high-resistance first transition metal oxide layer. In other words, it is conceivable that the oxygen ions inside the variable resistance layer 104 are drawn to the side of the first transition metal oxide layer causing oxidation reactions to occur in the fine filament formed inside the first transition metal oxide layer and thereby increasing the resistance of the fine filament when a positive voltage is applied to the electrode on the side of the first transition metal oxide layer with reference to the electrode on the other side. Conversely, it is conceivable that the oxygen ions inside the first transition metal oxide layer are pushed to the side of the second transition metal oxide layer causing reduction reactions to occur in the fine filament formed inside the first transition metal oxide layer and thereby decreasing resistance of the fine filament decrease when a negative voltage is applied to the electrode on the side of the first transition metal oxide layer with reference to the electrode on the other side.

The electrode connected to the first transition metal oxide layer having the lower level of oxygen deficiency comprises a material, such as platinum (Pt) or iridium (Ir) or the like, having a higher standard electrode potential than the transition metal included in the first transition metal oxide layer and the material included and the other electrode. With this sort of configuration, an oxidation-reduction reaction selectively occurs in the first transition metal oxide layer in the vicinity of the interface of the electrode and the first transition metal oxide layer, and a stable resistance changing phenomenon can be realized.

In the above process, after the memory cell hole 103 has been formed by patterning, the variable resistance layer (the first variable resistance layer 104a and the second variable resistance layer 104b) is deposited and formed on the entire surface of the wafer including inside the memory cell hole 103. Afterward, excess portions of the variable resistance layer outside of the memory cell hole 103 are removed by CMP to complete the patterning of the variable resistance layer. As a result, since an etching process is not required in the formation of the variable resistance layer, the variable resistance layer can be formed while in principle avoiding concerns associated with dry etching such as reactivity with etching gas, oxygen reduction damage, and charge damage.

Next, FIG. 2 (c) shows the process for forming the contact hole 106 which penetrates the interlayer insulating layer 102 and 112 and connects to the first line 101a after the interlayer insulating layer 112 is formed as the second interlayer insulating layer above the surface of the interlayer insulating layer 102. In this process, after first further depositing the interlayer insulating layer 112 on the entire surface of the planarized wafer, the interlayer insulating layer 102 and 112 are patterned using a desired photomask to form an opening, in other words, the contact hole 106, for electrical connection with the first line 101a. In the patterning, etching is stopped when the liner film 115 becomes exposed, before the first line 101a is exposed. Doing so oxidizes the surface of the first line 101a thereby preventing the first line 101a from corroding.

Next, FIG. 3 (a) shows the process for forming the line groove 108a which penetrates the interlayer insulating layer 112 and connects with the contact hole 106 and the variable resistance element. In this process, first a desired photomask for forming the line groove 108a to be filled with the second line (lead-out line) 108 and such is formed above the interlayer insulating layer 112, and the interlayer insulating layer 112 is patterned using this photomask. It is to be noted that the contact hole 106 may be filled with a resist before forming the line groove 108a. Doing so ensures that the liner film 115 on the bottom of the contact hole 106 is protected, thereby ensuring that the first line 101a will not become exposed in the dry etching process for forming the line groove 108a. After forming the line groove 108a, the liner film 115 on the bottom of the contact hole 106 is opened. It is to be noted that when the contact hole 106 is filled with a resist, the liner film 115 on the bottom of the contact hole 106 is opened after removing the resist filling the contact hole 106 by ashing, for example. In FIG. 3 (a), the line groove 108a is formed so that the first variable resistance layer 104a and the second variable resistance layer 104b (which also functions as the lower electrode of the MSM diode element) are exposed at the top of the memory cell hole 103.

The positional relationship between one end of the opening of the line groove 108a (the opening formed on a side surface in the interlayer insulating layer 112 and included in the line groove 108a) and an opening 106a of the contact hole 106 (the opening of the contact hole 106 in the surface of the interlayer insulating layer 102) in the formation of the line groove 108a plays an important role in the formation of the current steering layer of the MSM diode element, which will be described later.

Figure 5A:
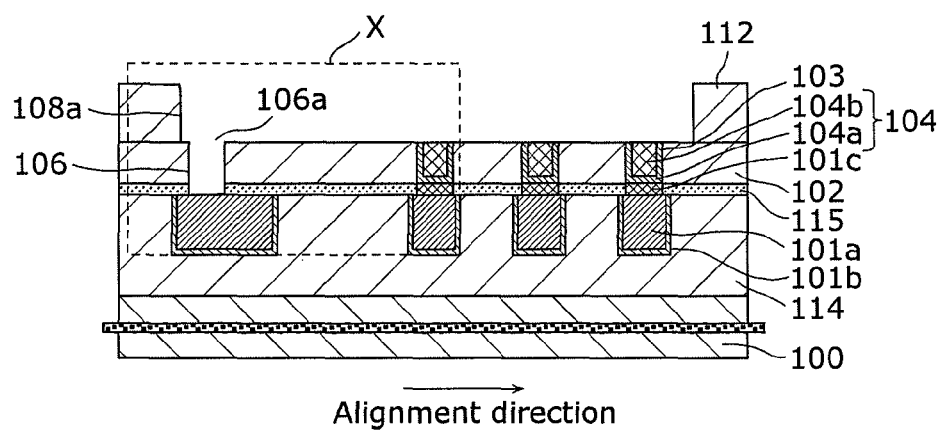
FIG. 5A is a cross-sectional view showing in detail the positional relationship between the line groove and the opening of the contact hole in the variable resistance nonvolatile memory device according to the first embodiment of the present invention.
Figure 5B:
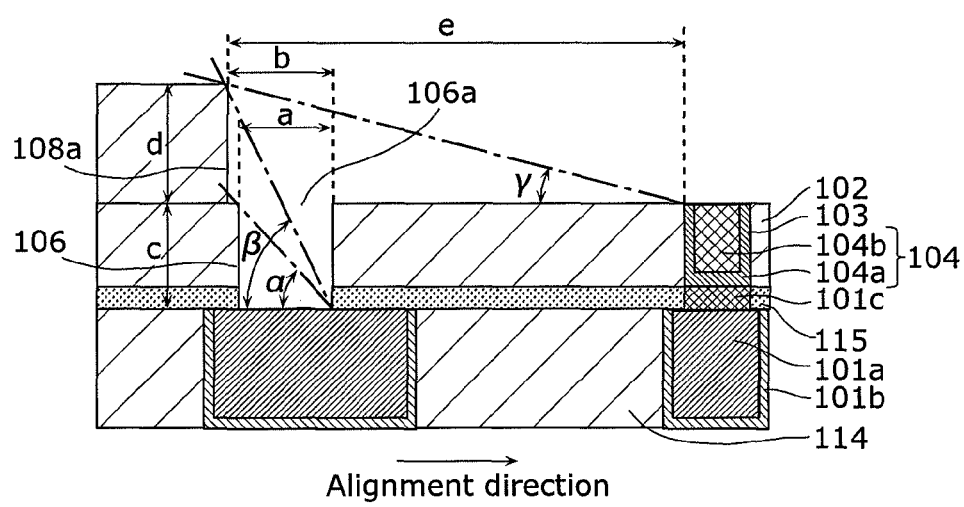
FIG. 5B is a cross-sectional view of an enlargement of a portion of the variable resistance nonvolatile memory device according to the first embodiment of the present invention (an enlargement of the portion labeled X in FIG. 5A).

FIG. 5A and FIG. 5B show in detail the positional relationship between the one end of the opening of the line groove 108a and the opening 106a of the contact hole 106. FIG. 5A is a cross-sectional view of the variable resistance nonvolatile memory device according to the first embodiment, and FIG. 5B is a cross-sectional view of a portion of the same nonvolatile memory device (an enlargement of the portion labeled X in FIG. 5A).

The contact hole 106 is positioned, in the alignment direction of the memory cell holes 103, between the memory cell hole 103 closest to an end of one side (the side close to the contact hole 106) of the opening of the line groove 108a and the end of the one side of the opening of the line groove 108a.

It is to be noted that the aperture (diameter) of the opening 106a of the contact hole 106 in a direction parallel to the extending direction and parallel to the main surface of the substrate 100 is represented as the variable a. The distance from one side of the opening 106a of the contact hole 106 (the right side shown in FIG. 5B), in other words from the end of the side furthest from the end (edge of the opening) of the one side (the left side shown in FIG. 5B) of the opening of the line groove 108a to the end of the one side of the opening of the line groove 108a in a direction parallel to the extending direction and parallel to the main surface of the substrate 100 is represented as the variable b. The height of the contact hole 106, that is to say the distance from the surface of the exposed first line 101a to the surface of the interlayer insulating layer 102, is represented as the variable c. The height of the line groove 108a, that is to say the distance from the surface of the interlayer insulating layer 102 to the surface of the interlayer insulating layer 112, is represented as the variable d. The distance from the end of the one side of the opening of the line groove 108a to the end of the opening (uppermost opening of the memory cell hole 103 in the surface of the interlayer insulating layer 102) closest to the end of the one side of the opening of the line groove 108a of the memory cell hole 103 closest to the end of the one side of the line groove 108a (the left side in FIG. 5B), that is to say the end of the side (edge of the opening) of the contact hole 106 on which the memory cell hole 103 is not provided, in a direction parallel to the extending direction and parallel to the main surface of the substrate 100 is represented as the variable e.

Here, the end of the "one side" of the opening 106a (the right side in FIG. 5B) is the end of the side of the opening 106a furthest from the end of the one side of the opening of the line groove 108a. The end of the "other side" of the opening 106a (the left side in FIG. 5B) is the end of the side of the opening 106a closest to the end of the one side of the opening of the line groove 108a. The distance between these two ends in a direction parallel to the extending direction and parallel to the main surface of the substrate 100 is represented as the variable a.

Moreover, the variables a, b, and e are values measured in the same direction and cross section for the contact hole 106, the memory cell hole 103, and the line groove 108a including the opening of the contact hole 106 and the opening of the memory cell hole 103, each of which are arranged in the extending direction.

The variables α, β, and γ are solved with the following equations using the variables a, b, c, d, and e.

$$\alpha = \tan^{-1}(c/a)$$

$$\beta = \tan^{-1}\{(c+d)/b\}$$

$$\gamma = \tan^{-1}(d/e)$$

All of the contact holes 106 for ohmic connectivity with the first line 101a (the current steering layer of the MSM diode element is not formed on the bottom), all of the memory cell holes 103, and the line groove 108a are formed in agreement with the conditions α>γ and β>α so that in a subsequent process, the opening of the memory cell hole 103 is covered by the current steering layer 111 and the bottom surface of the contact hole 106 remains uncovered by the current steering layer 111.

The processes shown in FIG. 2 (c) and FIG. 3 (a) makes it possible to increase the focus margin and control the fine and uniform dimensions of the contact hole 106 by forming the contact hole 106 by photolithography on the planarized interlayer insulating layer 112 first. In contrast, with the previously described prior art example, the focus margin decreases by no less than 100 nm and no more than 300 nm, approximately the depth of the line groove. Moreover, the top of the memory cell hole 103 can be opened while completely preventing the exposure of the first line 101a on the bottom of the contact hole 106.

Next, FIG. 3 (b) shows the process for forming the current steering layer 111 as the current steering layer of the MSM diode element, which is a current steering element, above the interlayer insulating layer 102, the interlayer insulating layer 112, and the variable resistance layer 104 so that the current steering layer 111 covers the inner surfaces of the line groove 108a (the bottom surface and the side surfaces), and does not cover the bottom surface of the contact hole 106. In this process, a nitrogen-deficient silicon nitride film ($SiN_x$ film) is deposited as the material for the current steering layer 111 on all surfaces, including the side surface of the contact hole 106 and the inner surfaces of the line groove 108a to which the first variable resistance layer 104a second variable resistance layer 104b are exposed. The nitrogen-deficient silicon nitride film is formed by a reactive sputtering process, that is to say, by sputtering a silicon target in a gas atmosphere of argon and nitrogen gas. The nitrogen content percentage is no less than 25 atm % and no more than 40 atm %.

Figure 6A:
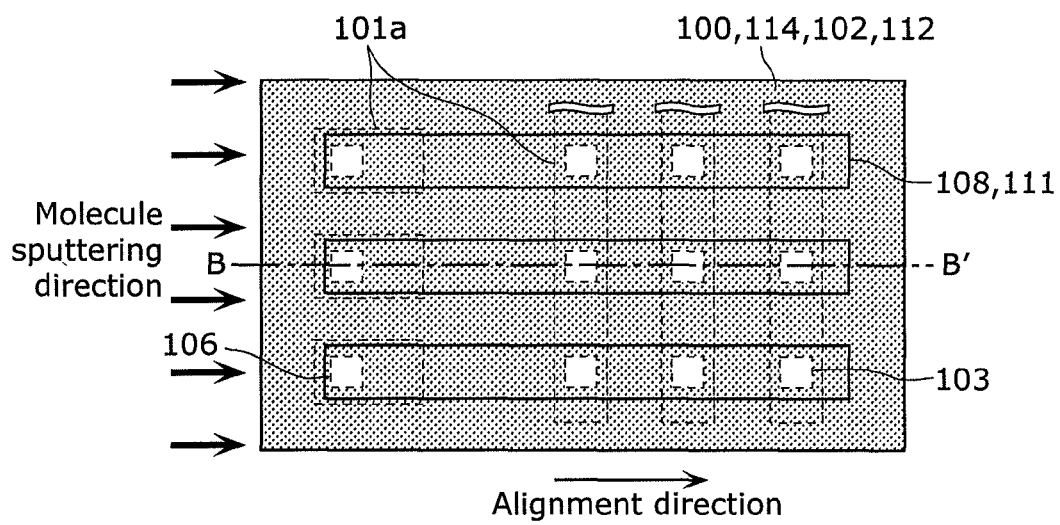
FIG. 6A is a plan view showing the sputtering direction of molecules of a material in the process for forming the current steering layer of the diode element in the variable resistance nonvolatile memory device manufacturing process according to the first embodiment of the present invention.
Figure 6B:
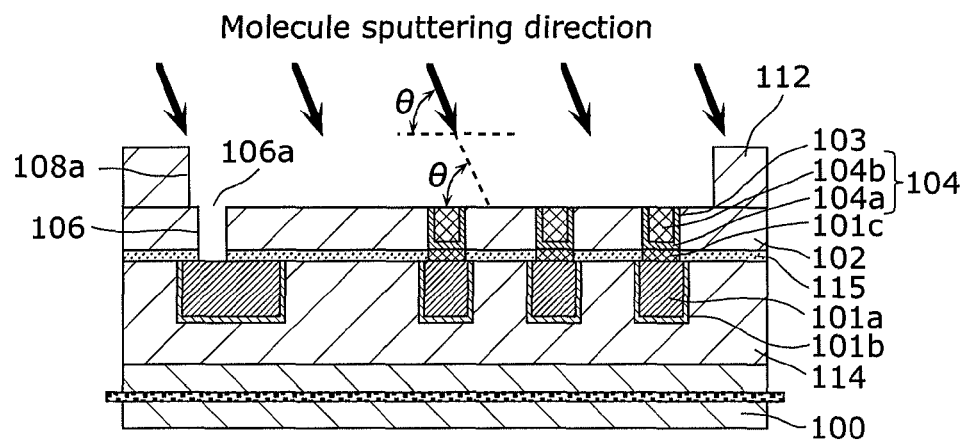
FIG. 6B is a cross-sectional view showing the sputtering direction of molecules of a material in the process for forming the current steering layer of the diode element in the variable resistance nonvolatile memory device manufacturing process according to the first embodiment of the present invention.

Here, in order to focus the sputtering direction of the molecules of a material (deposit material) in a single direction, a sputtering method having high directivity such as a long slow sputtering method in which a distance between the target and the substrate 100 is kept apart is used for the reactive sputtering in the formation of the current steering layer 111. The positional relationship between the sputtering direction of the molecules and the end of the line groove 108a as well as the opening 106a of the contact hole is shown in FIG. 6A and FIG. 6B. FIG. 6A is a plan view of the variable resistance nonvolatile memory device according to the first embodiment parallel to the surface of the substrate 100 (surface of the wafer), and FIG. 6B is a cross-sectional view perpendicular to the surface of the substrate 100 and parallel to the direction B-B' shown in FIG. 6A.

The sputtering direction of the molecules when viewing the surface of the substrate 100 from a vertical direction (when viewing the surface of the substrate 100 from above) is, as FIG. 6A shows, a direction that is parallel to the alignment direction of the plurality of memory cell holes 103 (parallel to the extending direction of the second line 108) and a direction, in the extending direction, from the end of the line groove 108a nearest the contact hole 106 toward the end of the line groove 108a furthest from the contact hole 106 (from left to right in FIG. 6A). It is to be noted that the variables a, b, c, d, and e in FIG. 5B are values in a cross section perpendicular to the main surface of the substrate 100 and parallel to the B-B' direction shown in FIG. 6A.

Figure 7:
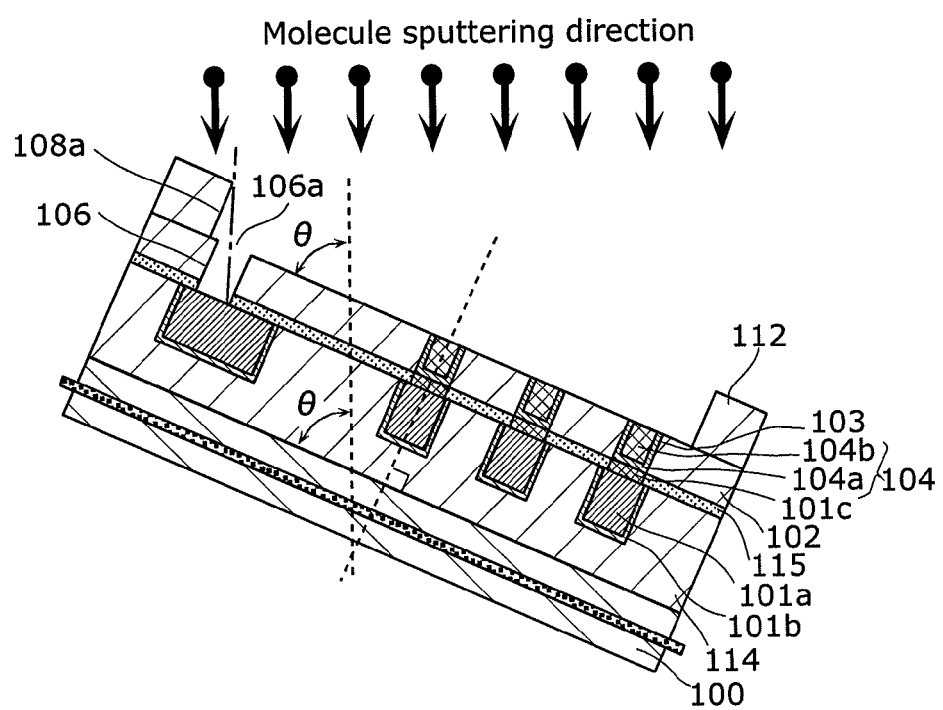
FIG. 7 is a cross-sectional view showing the sputtering method used in the process for forming the current steering layer of the diode element in the variable resistance nonvolatile memory device manufacturing process according to the first embodiment of the present invention.

Furthermore, the sputtering direction of the molecules from a perspective parallel to the surface of the substrate 100 (when viewing a cross section of the substrate 100 from the side) is, as FIG. 6B shows, a direction that is diagonal relative to the surface of the substrate 100, that is to say, has an angle θ, and is a direction that is parallel to the direction of the cross section in which the variables a, b, and e are measured. In actuality, as FIG. 7 shows, this formation method is realizable by depositing the molecules while the substrate 100 is tilted at the angle θ relative to a direction vertical to the B-B' direction with respect to the sputtering direction of the molecules. With this, since the sputtered molecules cannot reach the areas that are not visible when viewed from the sputtering direction of the molecules, the current steering layer 111 of the MSM diode element is not formed in these areas. Conversely, the current steering layer 111 of the MSM diode element is formed in all other areas.

When the sputtering direction of the molecules is as shown in FIG. 6A and FIG. 6B, the end of one side of the line groove 108a that defines the length e in FIG. 5B is positioned in front of the sputtering destination in the sputtering direction of the molecules. Furthermore, the end of the side of the memory cell hole 103 nearest this end of the one side of the line groove 108a is the other end that determines the length e.

Here, when the condition θ<α is met, the sputtered molecules do not reach the bottom surface of the contact hole 106 since the bottom surface is shadowed by the interlayer insulating layer 102. However, when θ≤γ, there are memory cell holes 103 to which the sputtered molecules do not reach. In other words, when the angle θ and the variables α and γ meet the condition γ≤θ<α, it becomes possible to form the current steering layer 111 of the MSM diode element on the bottom surface of the line groove 108a including the tops of all the memory cell holes 103 exposed in the opening of the line groove 108a without forming the current steering layer 111 of the MSM diode element on the bottom surface of the contact hole 106. That is to say, it is possible to form the current steering layer 111 of the MSM diode element in the areas of the line groove 108a other than the areas that are not visible when seen from the molecule sputtering direction.

Figure 8:
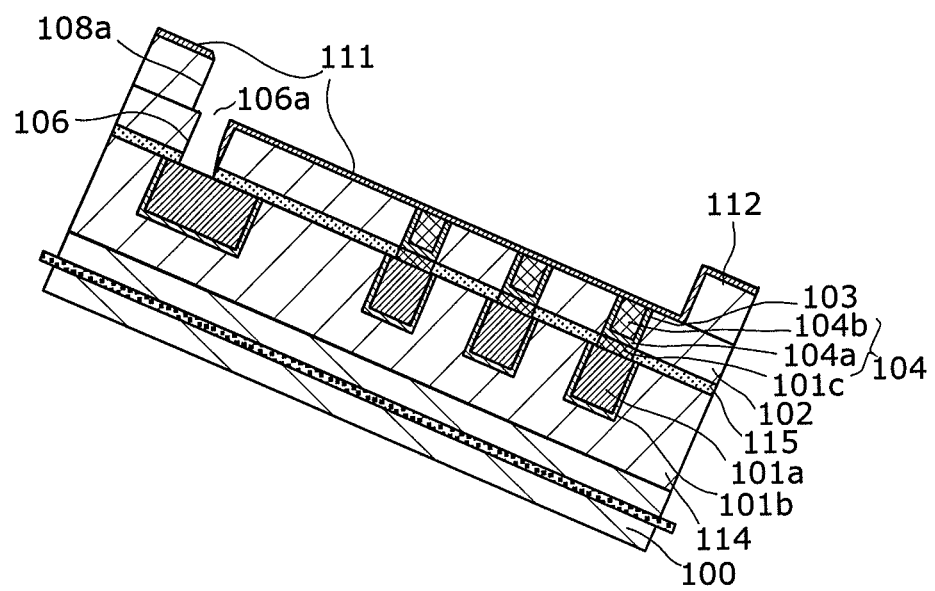
FIG. 8 is a cross-sectional view showing the current steering layer after the sputtering in the process for forming the current steering layer of the diode element in the variable resistance nonvolatile memory device manufacturing process according to the first embodiment of the present invention.

As FIG. 6A and FIG. 6B show, when the sputtering direction of the molecules is angled at the angle θ relative to a direction vertical to the substrate 100 and the molecules are deposited, the smaller the angle θ is, the lower the sputter rate becomes. Furthermore, from the standpoint of keeping inconsistencies in the film thickness of the current steering layer 111 due to warping of the substrate 100 (wafer) to a minimum, a larger angle θ is preferable. For this reason, it is preferable that the sputtering direction of the molecules is limited only to the direction shown in FIG. 6A, that is to say, the direction from the end of the one side of the opening of the line groove 108a toward the contact hole 106, and that the conditions β>α and θ<β are met and the angle θ is increased to a value that is approximately the value of β. In this case, since the entire bottom surface of the contact hole 106 is blocked from view when viewed from the molecule sputtering direction, the sputtered molecules do not reach the bottom surface of the contact hole 106. Furthermore, by meeting the condition γ<θ, the sputtered molecules reach the tops of every memory cell hole 103. By making the angle θ and the variables α and γ meet the condition γ<θ<β, it is possible to form the current steering layer 111 of the MSM diode element on the contact hole 106 side wall that is located furthest in the molecule sputtering direction as well as on the bottom surface of the line groove 108a including the tops of all memory cell holes 103 exposed in the opening of the line groove 108a, and not form the current steering layer 111 of the MSM diode element on the bottom surface of the contact hole 106. That is to say, it is possible to form the current steering layer 111 of the MSM diode element in areas other than the areas blocked from vision when viewed from the molecule sputtering direction (FIG. 8, FIG. 3 (b)).

Next, FIG. 3 (c) and FIG. 4 (a) and (b) show the process of forming the second line 108 and the barrier film 109a.

In this process, first the barrier film 109a and the line material, copper, are successively disposed using a sputtering method on all surfaces including above the first line 101a exposed to the bottom of the contact hole contact hole 106 and above the current steering layer 111 formed on the surface of the interlayer insulating layer 112 and the inner surface of the line groove 108a. The barrier film 109a improves the adhesiveness of the interlayer insulating layer 102 comprising silicon oxide film and such and the second line 108 comprising copper, and inhibits the diffusion of the copper of the second line 108 in the interlayer insulating layer 102. Opposite of the case of the formation of the current steering layer 111 of the diode element MSM in FIG. 3 (b), the condition θ>β, and more preferably, θ≈90°, is required since the molecules are required to reach the bottom surface of the contact hole 106 in the sputtering in this case.

Next, all of the contact holes 106 and the line grooves 108a are filled with the line material, copper 150, by an electrolytic plating method using the deposited copper as the seed to further deposit copper (FIG. 3 (c)).

Next, excess copper is removed from the surfaces of the interlayer insulating layer 112 and the second line 108 while also planarizing the surfaces by CMP in order to planarize (make flush) the surfaces of the interlayer insulating layer 112 and the second line 108 (FIG. 4 (a)). At this time, the portion of the barrier film 109a not inside the line groove 108a and the current steering layer 111 therebelow are removed at the same time to prevent leak current from occurring between a second line 108 in a different line groove 108a.

Afterward, an SiN film having a thickness no less than 30 nm and no more than 200 nm is deposited above the planarized surfaces of the interlayer insulating layer 112 and the second line 108 using plasma CVD, for example, to form the liner film 116 covering the copper that is the second line 108 (FIG. 4 (b)).

Here, in FIG. 4 (b), the second line 108 and the barrier film 109a formed inside the contact hole 106 function as a contact plug. As such, with the manufacturing processes shown in FIG. 4 (a) and (b), by forming, in this order, the barrier film 109a functioning as the upper electrode of the MSM diode element then the second line 108 comprising line material inside the contact hole 106 and the line groove 108a, the upper electrode of the MSM diode element connected to the variable resistance element and the contact plug in the contact hole 106 are formed at the same time.

Figure 9A:
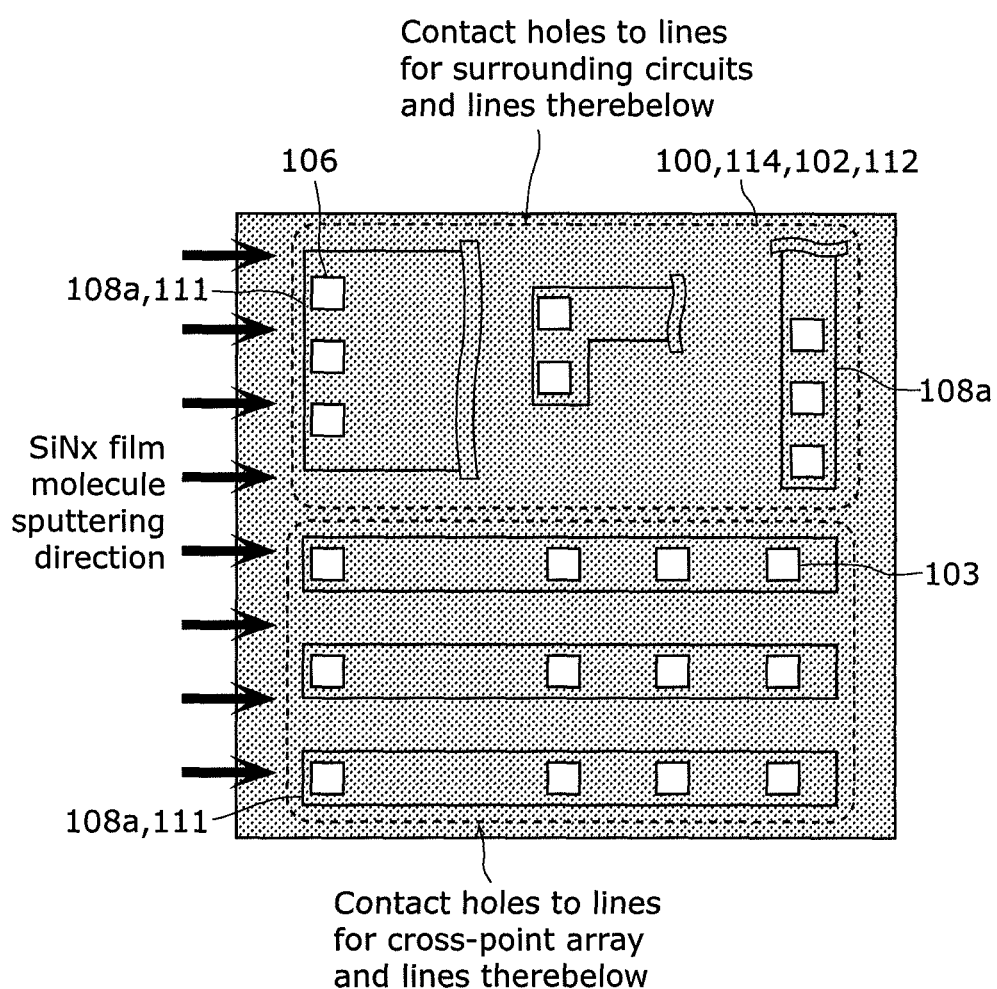
FIG. 9A is a plan view showing the configuration of the line groove and the opening of the contact hole in the variable resistance nonvolatile memory device according to the first embodiment of the present invention.

It is to be noted that in the above description, the second line 108 is only described as being a line which connects the contact hole 106 and the memory cell hole 103 in the crosspoint array, and being a line which connects memory cell holes 103. However, in an actual integrated circuit, the second line 108 and other second lines 108 in the same layer are used as lines for forming surrounding circuits for driving the crosspoint array. In this case as well, as FIG. 9A shows, when the line groove 108a and the contact hole 106 are formed meeting the condition α>γ, it is possible to form the current steering layer 111 of the MSM diode element on the bottom surface of the contact hole 106 of a surrounding circuit.

Figure 9B:
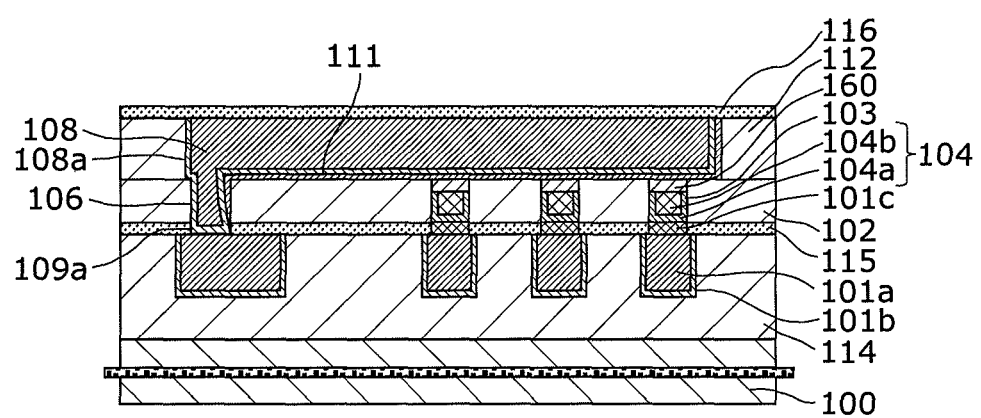
FIG. 9B is a cross-sectional view showing a variation of the variable resistance nonvolatile memory device according to the first embodiment of the present invention.

Here, since the second variable resistance layer 104b is a tantalum oxide having conductivity, it can also be used as the metal for the lower electrode of the MSM diode element. Furthermore, the current steering layer 111 of the MSM diode element can also be used as the upper electrode of the variable resistance element including the first electrode 101c and the variable resistance layer 104, making it possible to use a structure which omits an intermediate electrode (a structure including the variable resistance element and the current steering element made up of four layers: the lower electrode of the variable resistance layer, the variable resistance layer, the current steering layer, and the upper electrode). However, it goes without saying that a separate intermediate electrode may be formed between the variable resistance layer 104 and the current steering layer 111. When the intermediate electrode has a low resistance value, it is preferable that the intermediate electrode be located separately in each variable resistance element from the standpoint of preventing cross talk between adjacent memory cells. As FIG. 9B shows, it is possible to form an intermediate electrode 160 by first forming a recessed region in the upper portion of the memory cell hole 103 by causing the upper surfaces of the first variable resistance layer 104a and the second variable resistance layer 104b filled in the memory cell hole 103 to recede toward the substrate 100 by etching or over polishing by CMP, then depositing an intermediate electrode material (TaN, for example) and polishing off excess intermediate electrode by CMP so that material only remains in the recessed region in the upper portion of the memory cell hole 103.

Moreover, the above description is regarding a single cross-point array layer in which a single memory cell hole 103 layer is formed between the first line 101a and the second line 108. However, the nonvolatile memory device may be a multi-layer cross-point array including, for example, a second memory cell hole 103 layer formed above the second line 108 and, furthermore, a third line formed thereabove. In this case, since the extending direction of the third line is approximately orthogonal to the extending direction of the second line 108, the direction of the cross-section and molecule sputtering direction for the current steering layer of the MSM diode element which define the variables a, b, c, and d for the second layer formed between the second line 108 and the third line including the contact hole 106, the memory cell hole 103, and the line groove 108a is approximately orthogonal to the extending direction of the second line in conformity with the extending direction of the third line. Moreover, in the case of a three-layer cross-point array, the direction of the cross-section and molecule sputtering direction for the current steering layer of the MSM diode element which define the variables a, b, c, and d for a third layer including the contact hole 106, the memory cell hole 103, and the line groove 108*a* is approximately orthogonal to the extending direction of the third line.

Figure 10A:
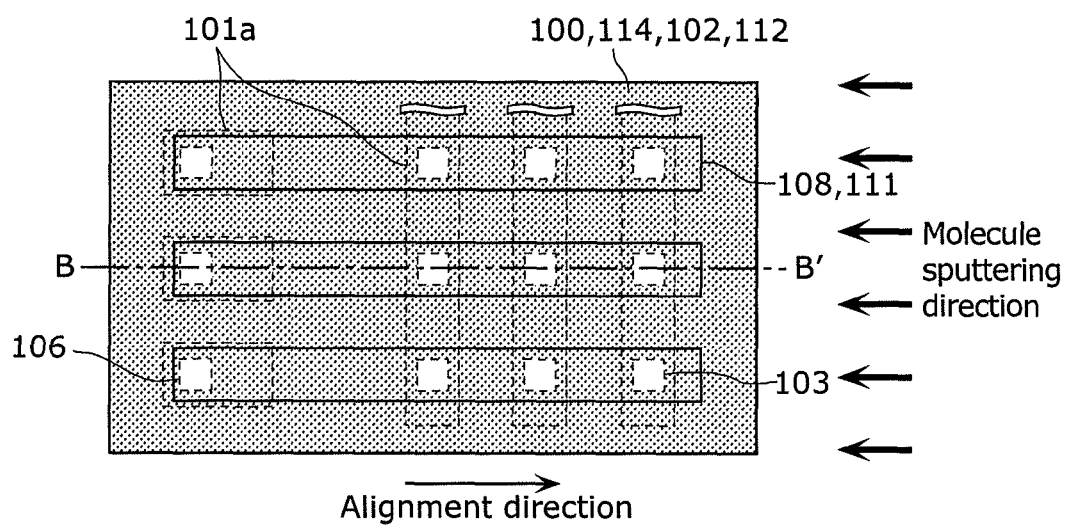
FIG. 10A is a plan view showing a variation of the sputtering direction of molecules of a material in the process for forming the current steering layer of the diode element in the variable resistance nonvolatile memory device manufacturing process according to the first embodiment of the present invention.
Figure 10B:
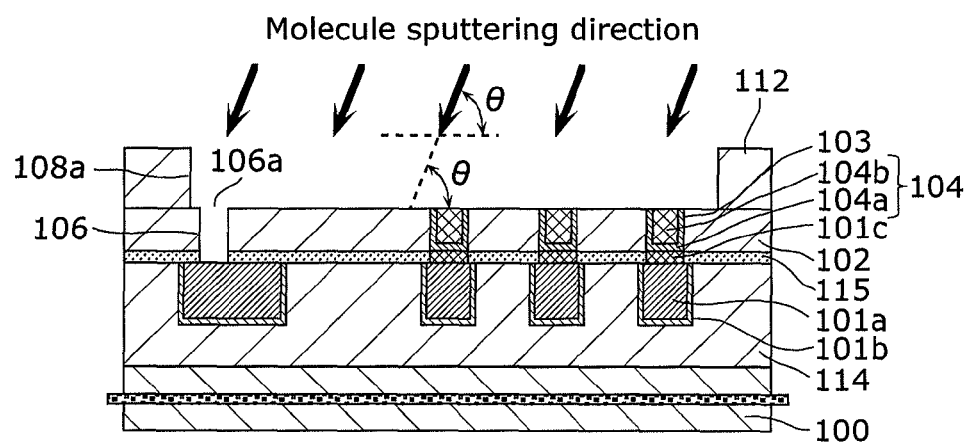
FIG. 10B is a cross-sectional view showing a variation of the sputtering direction of molecules of a material in the process for forming the current steering layer of the diode element in the variable resistance nonvolatile memory device manufacturing process according to the first embodiment of the present invention.

Moreover, in the above description, the molecule sputtering direction is a direction in the arrangement direction of the contact hole 106 pointing from an end of the line groove 108*a* closest to the contact hole 106 toward the far end of the line groove 108*a*, as FIG. 6A and FIG. 6B show (a direction from left to right in FIG. 6A). However, as long as the condition $\gamma<\theta<\alpha$ is met, the molecule sputtering direction may be a direction that is a direction opposite the sputtering direction shown in FIG. 6A, that is to say, a direction in the arrangement direction of the contact hole 106 pointing from an end of the line groove 108*a* furthest from the contact hole 106 toward the close end of the line groove 108*a*, as FIG. 10A and FIG. 10B show (a direction from right to left in FIG. 6A). In this case, it is not absolutely necessary for the condition $\beta>\alpha$ to be met.

By using the above-described manufacturing method, it is possible to form the current steering layer 111 of the MSM diode element in the line groove 108*a* so as to cover the opening of the memory cell holes 103 without forming the current steering layer 111 of the MSM diode element on the bottom surface of the contact hole 106. This allows for the formation of the MSM diode element inside the line groove 108*a* above the memory cell holes 103 while also maintaining a low contact resistance between the first line 101*a* and the contact plug. Consequently, it is possible to realize a variable resistance nonvolatile memory device which enables large capacity and high integration through miniaturization.

In other words, in the process for forming the current steering layer 111 of the MSM diode element in the line groove 108*a* including the memory cell holes 103, it is possible to selectively not form the current steering layer 111 of the bidirectional diode element on the bottom surface of the contact hole 106 without using a removal process such as etching. This is possible due to both the ingenuity of the planar layout of the second line 108 and the contact hole 106 as well as the film forming method in which the molecule sputtering direction is confined in the formation of the current steering layer 111 of the bidirectional diode element. This makes it possible to make the contact resistance between the first line 101*a* and the contact plug ohmic and low while also forming the bidirectional diode in the line groove 108*a* above the memory cell hole 103. Consequently, it is possible to realize a variable resistance nonvolatile memory device which enables large capacity and high integration through miniaturization.

Moreover, it is also possible to form the line groove 108*a* after the formation of the contact hole, secure the focus margin in the lithography process for forming the contact hole 106 (the focus margin increases by 100 to 300 nm, which is approximately the depth of the line groove, compared to the lithography process for forming the contact hole above the line groove 108*a* level in the prior art example), and accurately form a contact hole 106 having minute dimensions in the surface of the wafer. As a result, a variable resistance nonvolatile memory device which has good consistency with a dual damascene process that is suitable for the formation of fine copper lines can be achieved.

Second Embodiment

Figure 11A:
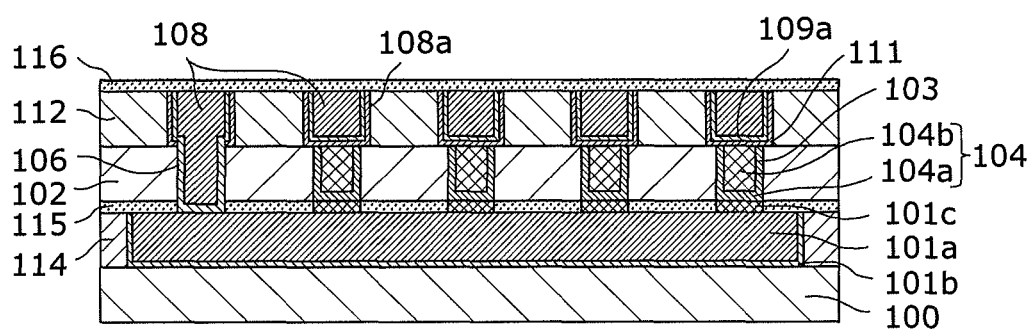
FIG. 11A is a plan view showing the variable resistance nonvolatile memory device according to the second embodiment of the present invention.
Figure 11B:
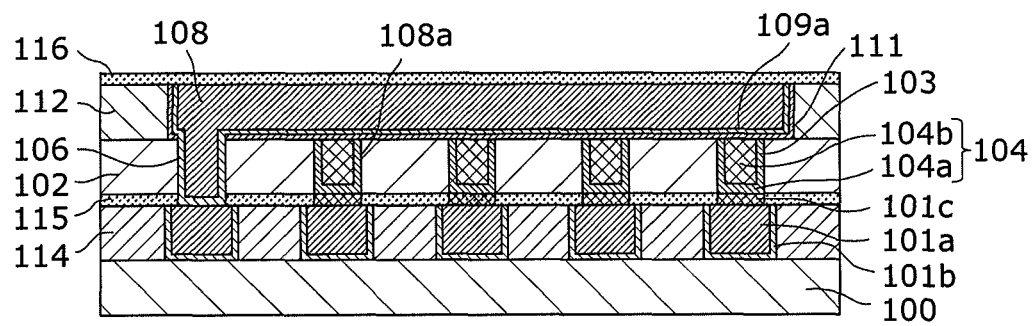
FIG. 11B is a cross-sectional view showing the variable resistance nonvolatile memory device according to the second embodiment of the present invention.
Figure 12:
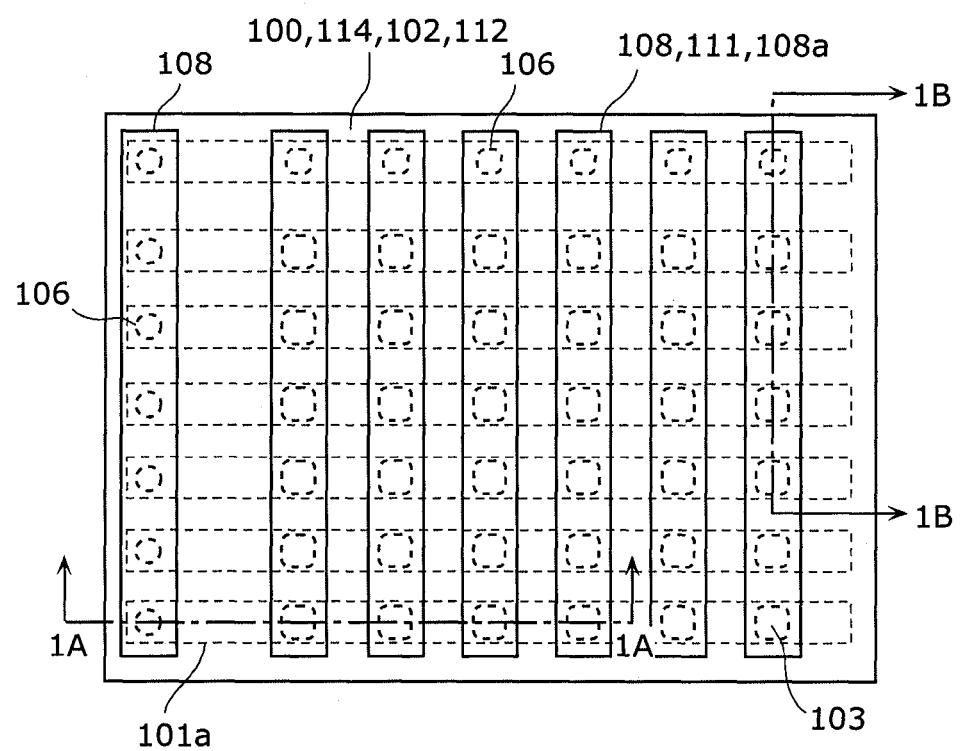
FIG. 12 is a plan view showing the variable resistance nonvolatile memory device according to the second embodiment of the present invention.

FIG. 11A and FIG. 11B are cross-sectional views showing an example of a configuration of the variable resistance nonvolatile memory device according to the second embodiment of the present invention. FIG. 12 is a plan view showing an example of a configuration of the variable resistance nonvolatile memory device according to the second embodiment. It is to be noted that FIG. 11A is a cross-sectional view at the single dotted-and-dashed line labeled 1A in FIG. 12 as viewed in the direction of the arrows, and FIG. 11B is a cross-sectional view at the single dotted-and-dashed line labeled 1B in FIG. 12 as viewed in the direction of the arrows.

The configuration of this nonvolatile memory device (cross-point memory) is nearly the same as the cross-sectional view of the prior art shown in FIG. 25A and FIG. 25B and plan view shown in FIG. 26. The elements shown in FIG. 11A, FIG. 11B and FIG. 12 share the same reference numerals as the elements shown in FIG. 25A, FIG. 25B, and FIG. 26 having essentially the same functions. The second embodiment is different from the prior art example in that the first electrode 101 disclosed in the prior art example is provided on a first line 101*a* as a first electrode 101*c* in the second embodiment. Moreover, in the prior art example, the second electrode 105 is provided separate from the second variable resistance layer 104*b* as a lower electrode of the MSM diode element. However, in the second embodiment, the second variable resistance layer 104*b* also performs as the lower electrode of the MSM diode element. Furthermore, the second embodiment is different in that it includes a liner film 115 and 116 for preventing the copper lines from oxidizing.

The plan view FIG. 12 shows the first lines 101*a* including a plurality of cross-point array lines aligned parallel to each other in a stripe pattern and lines for connecting the cross-point array lines to the surrounding circuit, and the second lines 108 including a plurality of cross-point array lines aligned parallel to each other in a stripe pattern and lines for connecting the cross-point array lines to the surrounding circuit. The memory cell hole 103 is formed at the cross point of the cross-point array line of the first line 101*a* and the cross-point array line of the second line 108. A plurality of the line grooves 108*a* are formed and the plurality of line grooves 108*a* extend in the same direction.

Figure 13A:
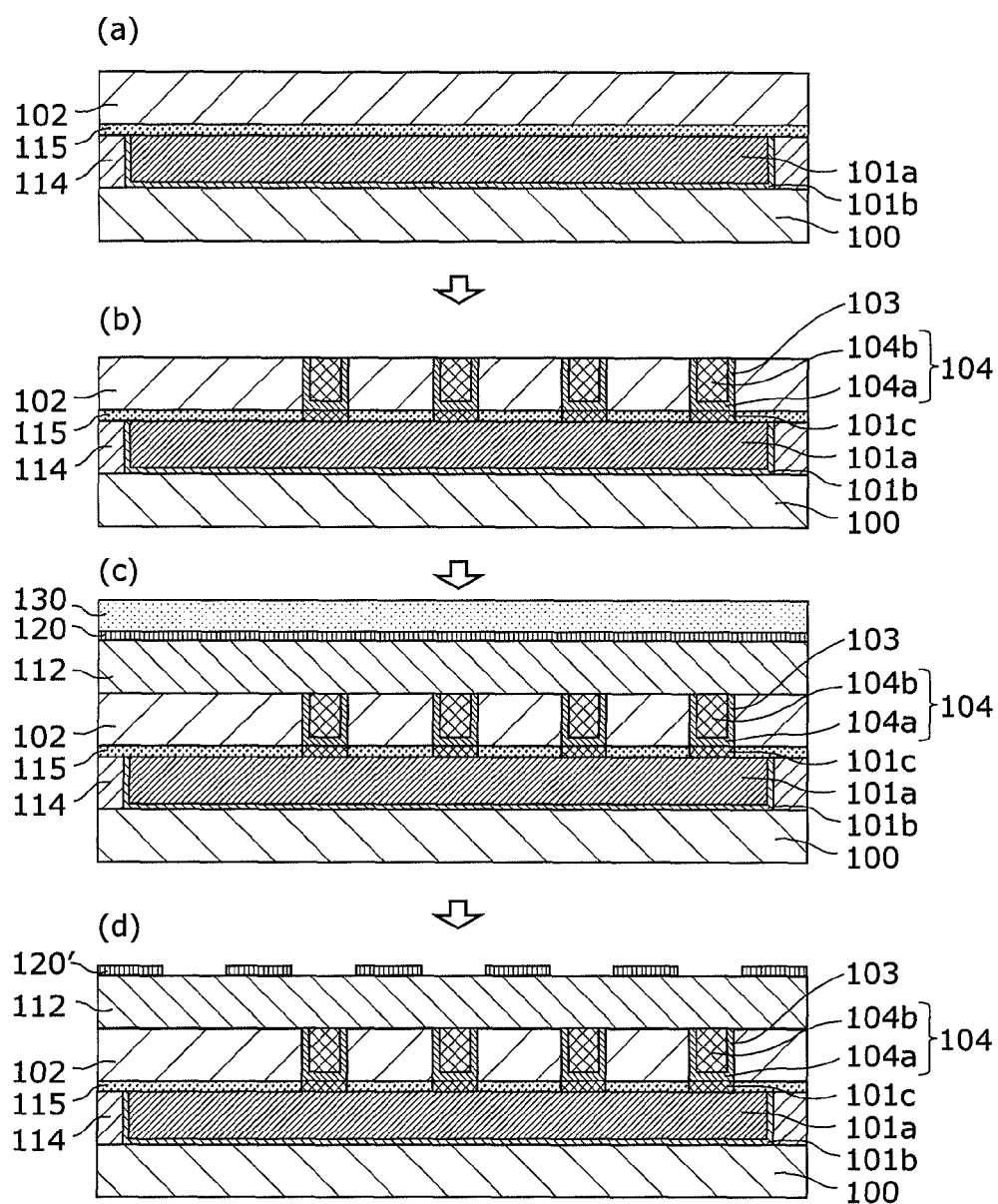
FIG. 13A is a cross-sectional view showing the main processes of the variable resistance nonvolatile memory device manufacturing method according to the second embodiment of the present invention.
Figure 13B:
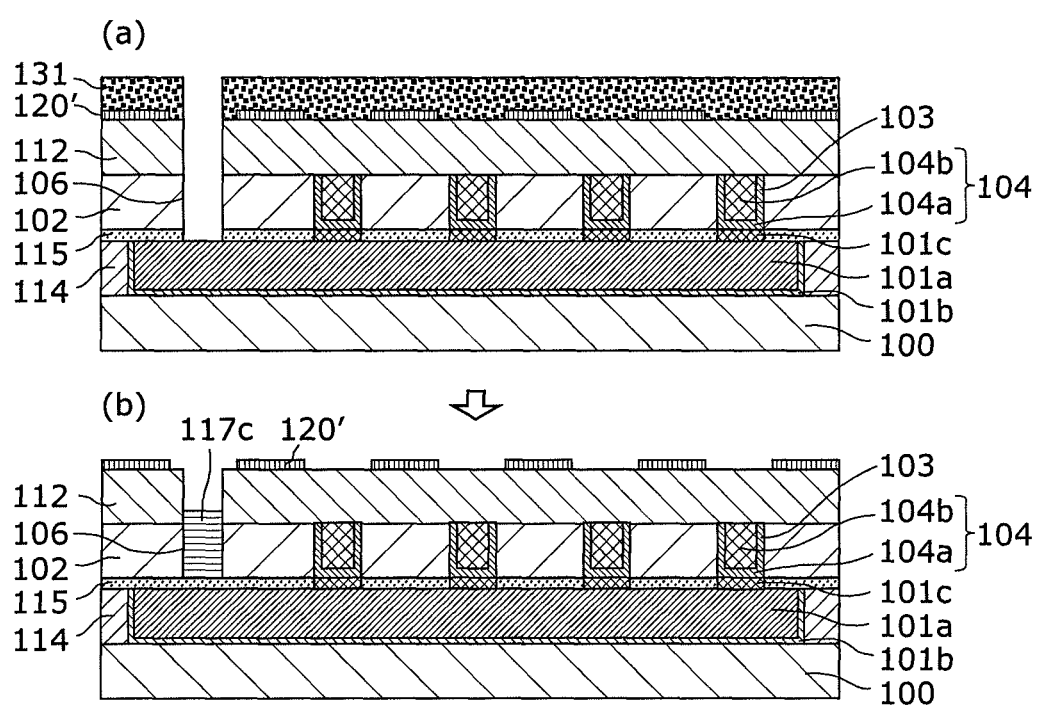
FIG. 13B is a cross-sectional view showing the main processes of the variable resistance nonvolatile memory device manufacturing method according to the second embodiment of the present invention.
Figure 14:
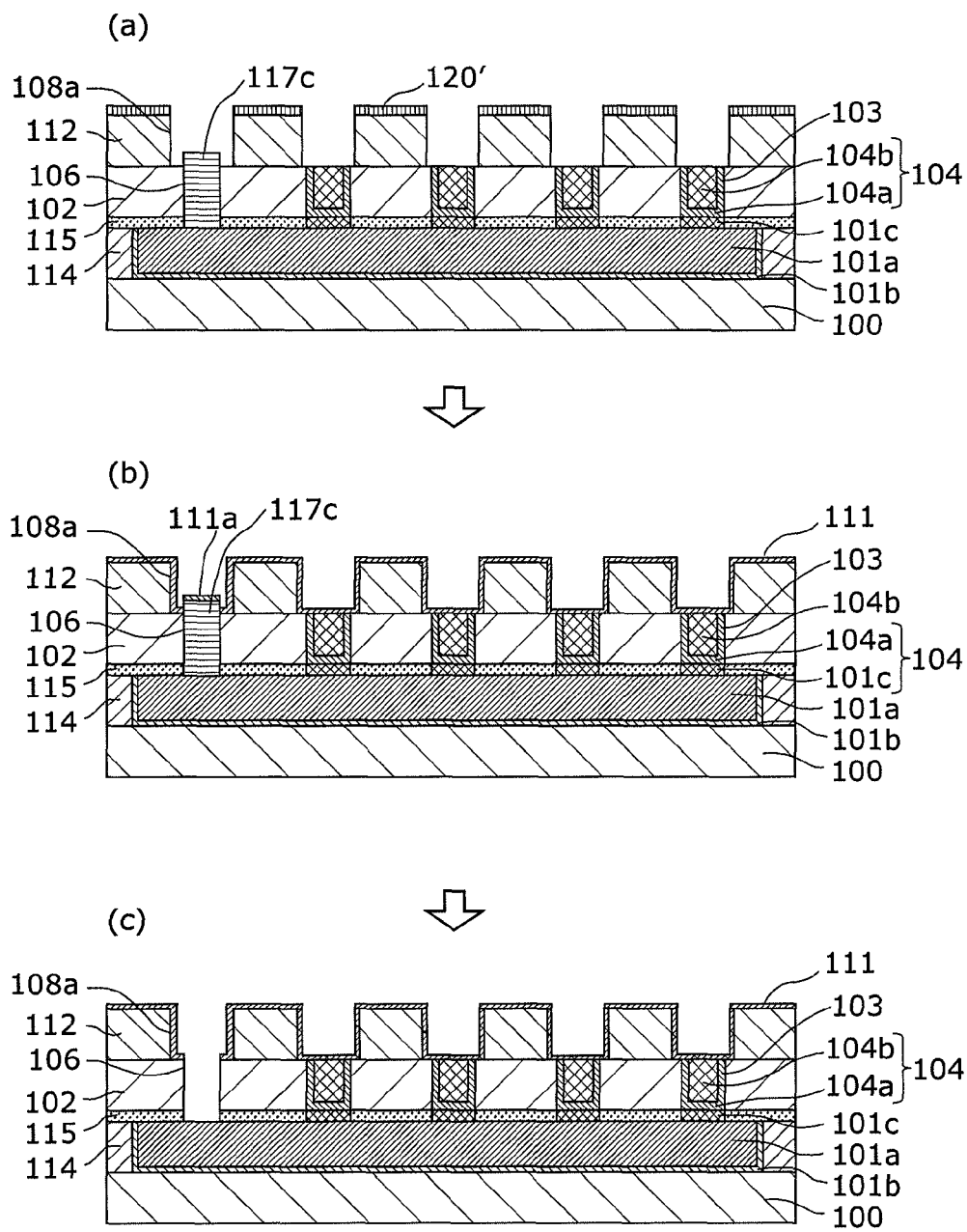
FIG. 14 is a cross-sectional view showing the main processes of the variable resistance nonvolatile memory device manufacturing method according to the second embodiment of the present invention.
Figure 15:
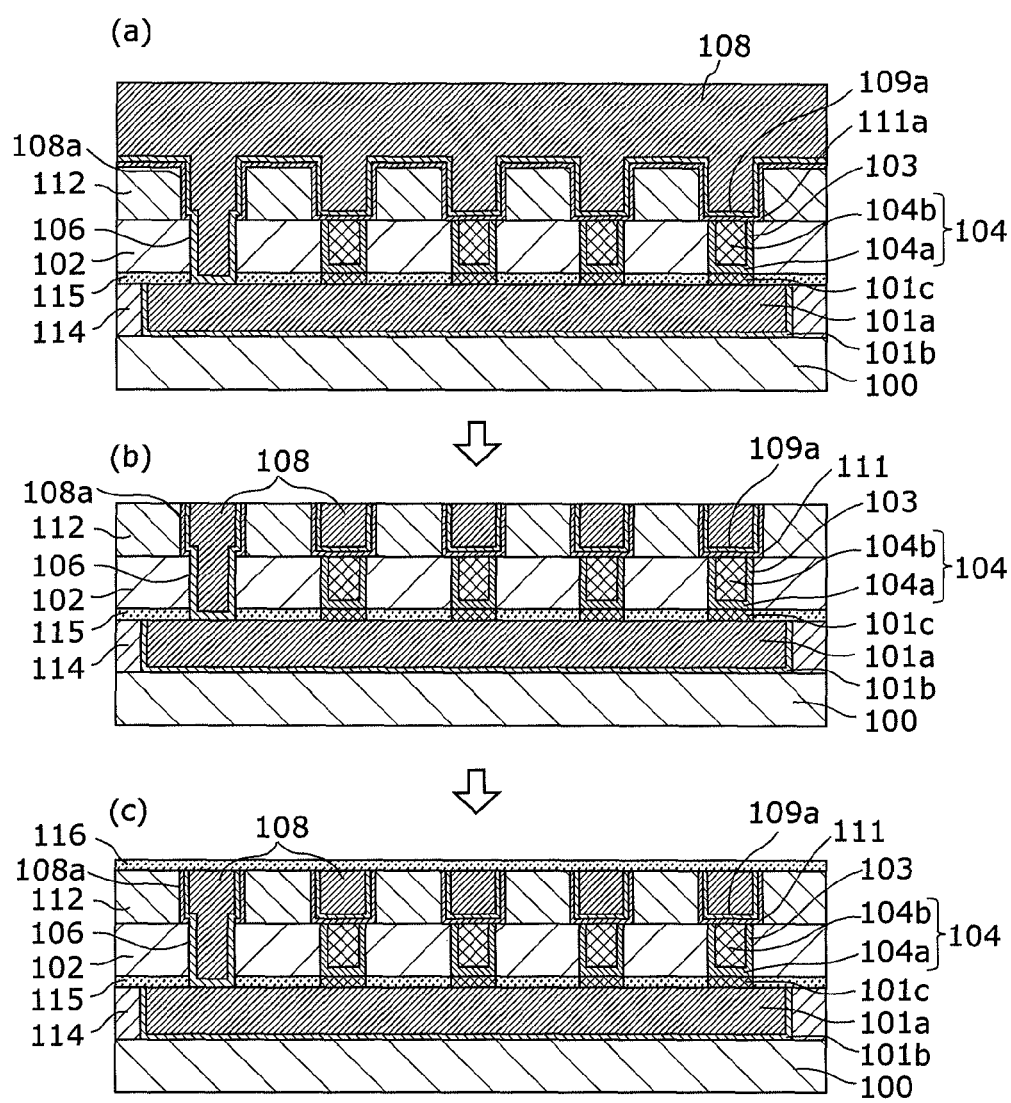
FIG. 15 is a cross-sectional view showing the main processes of the variable resistance nonvolatile memory device manufacturing method according to the second embodiment of the present invention.

FIG. 13A (*a*) through (*d*), FIG. 13B (*a*) and (*b*), FIG. 14 (*a*) through (*c*), and FIG. 15 (*a*) through (*c*) are cross-sectional views showing the main processes of the variable resistance nonvolatile memory device manufacturing method according to the second embodiment. The method of manufacturing will be discussed using each of these drawings.

First, FIG. 13A (*a*) shows the process for forming the first line 101*a* and the interlayer insulating layers 102 and 114. In this process, firstly, the interlayer insulating layer 114 comprising a silicon oxide film (for example, a plasma TEOS film or an FSG film) is formed by, for example, plasma CVD above the substrate 100 on which transistors and lower layer lines and such are formed. Next, the line groove to be filled with the first line 101*a* is formed in the interlayer insulating layer 114 by photolithography and dry etching. Next, the barrier film 101*b* comprising TaN (film thickness: no less than 5 nm and no more than 40 nm) and Ta (film thickness: no less than 5 nm and no more than 40 nm), and copper line material (film thickness: no less than 50 nm and no more than 300 nm) are successively deposited in the formed line groove by, for example, sputtering. Next, the first lines 101*a* are formed in a stripe pattern above the substrate 100 by filling all of the line grooves with the copper line material by further depositing copper with an electrolytic plating method using the deposited copper as the seed. Furthermore, a CMP process is used to remove excess copper from and planarize (make flush) the surfaces of the interlayer insulating layer 114 and the first line 101*a*. Next, a SiN film having a thickness of approximately no less than 30 nm and no more than 200 nm is deposited by, for example, plasma CVD to cover the copper first line 101*a*, thereby forming the liner film 115. The interlayer insulating layer 102 is then further deposited on the liner film 115 (plurality of first lines 101*a*) as the first interlayer insulating layer, and if necessary, the surface of the interlayer insulating layer 102 is leveled by CMP.

FIG. 13A (b) shows the process for forming the memory cell hole 103 which penetrates the interlayer insulating layer 102 to connect to the first line 101*a*. In this process, firstly, an opening, which is the memory cell hole 103, is formed which penetrates the interlayer insulating layer 102 and the liner film 115 and electrically connects to the first line 101*a*. Next, the first electrode 101*c* comprising a noble metal and such is selectively formed only on the copper first line 101*a* on the bottom of the memory cell hole 103 by, for example, electroless plating. For example, Pt, Ir, and Pd and the like are grown to be no less than 2 nm and no more than 30 nm. Here, Pt is grown to be about 5 nm. At this time, a foundation plating layer comprising Ni and such may be grown between the copper and the noble metal. In this case, compared to when the foundation of the first electrode 101*c* is copper, the electroless plating is easier to control. Next, the first variable resistance layer 104*a* comprising tantalum oxide and such is formed by sputtering a tantalum target in a mixed gas atmosphere of argon and oxygen, in other words, by a reactive sputtering method, on the first electrode 101*c* on the bottom of the memory cell hole 103, on the side walls of the memory cell hole 103, and on the surface of the interlayer insulating layer 102. When using reactive sputtering, oxygen content atomic percentage can be increased by increasing the flow rate of oxygen at the time of deposition. Here, sputtering is performed at a power of 1.6 kW while flowing argon gas at 34 sccm and oxygen gas at 24 sccm to form the first variable resistance layer 104*a* having an oxygen content atomic percentage of approximately 71 atm %. Next, tantalum oxide for the second variable resistance layer 104*b* having a lower oxygen content atomic percentage than that of the first variable resistance layer 104*a* is formed inside the memory cell hole 103 on the surface of which the first variable resistance layer 104*a* is formed, that is to say, formed above the first variable resistance layer 104*a* formed inside the memory cell hole 103. This formation is performed by reactive sputtering at the same time the first variable resistance layer 104*a* is formed. Here, sputtering is performed at a power of 1.6 kW while flowing argon gas at 34 sccm and oxygen gas at 20.5 sccm to form the second variable resistance layer 104*b* having an oxygen content atomic percentage of approximately 60 atm %. In the formation of the second variable resistance layer 104*b*, sputtering is performed to deposit the tantalum oxide inside the memory cell hole 103 until the memory cell hole 103 is filled, then excess tantalum oxide above the surface of the interlayer insulating layer 102 is removed by CMP so that the first variable resistance layer 104*a* and the second variable resistance layer 104*b* are only formed in the memory cell hole 103. With this, the memory cell hole 103 is filled with the variable resistance element.

In the above process, after the memory cell hole 103 has be formed by patterning, the variable resistance layer (the first variable resistance layer 104*a* and the second variable resistance layer 104*b*) is deposited and formed on the entire surface of the wafer including inside the memory cell hole 103. Afterward, excess portions of the variable resistance layer outside of the memory cell hole 103 are removed by CMP to complete the patterning of the variable resistance layer. As a result, since an etching process is not required in the formation of the variable resistance layer, the variable resistance layer can be formed while in principle avoiding concerns associated with dry etching such as reactivity with etching gas, oxygen reduction damage, and charge damage. Here, since the second variable resistance layer 104*b* is a tantalum oxide having conductivity, it can also be used as the metal for the lower electrode of the MSM diode element.

Next, FIG. 13A (c) shows the process for forming a hard mask layer 120 and a photoresist layer 130 after the interlayer insulating layer 112 is formed as the second interlayer insulating layer above the surface of the interlayer insulating layer 102, and FIG. 13A (d) shows the process for forming a hard mask pattern 120' for forming the line groove. Moreover, FIG. 13B (a) shows the process for forming the contact hole 106 which penetrates the interlayer insulating layer 102 and 112 and connects to the first line 101*a*. FIG. 13B (b) shows the process for filling the formed contact hole 106 with resist material.

In this process, as FIG. 13A (c) shows, after further depositing the interlayer insulating layer 112 above the entire surface of the planarized wafer, the hard mask layer 120 (lay comprising a metal such as Ti or TiN, or a metal nitride) whose etching selectivity ratio is high with respect to the interlayer insulating layer 112 and the photoresist layer 130 are deposited on the entire surface. At this time, in the lithography process for the contact hole 106, the hard mask layer 130 is made to be thin in order to increase the focus margin. For example, the hard mask layer 120 is set to be no more than 30 nm. Next, a photoresist pattern is formed for patterning the line groove 108*a*, and the hard mask 120' is formed by etching the hard mask layer 120 using the formed photoresist pattern, as FIG. 13A (d) shows. The photoresist pattern used to form the hard mask 120' is removed by ashing. Next, as FIG. 13B (a) shows, a new photoresist pattern 131 is formed and the interlayer insulating layer 102 and 112 are patterned to form an opening, in other words, the contact hole 106, for electrical connection with the first line 101*a*. In the patterning, etching is performed to penetrate the liner film 115 and expose the first line 101*a*.

Next, FIG. 13B (b) shows the process for filling the contact hole 106 with a resist 117*c*. In this process, the resist 117*c* is applied in the contact hole 106 and above the surface of the interlayer insulating layer 112, and the entire surface is etching by ashing using oxygen gas, thereby forming the resist 117*c* filling the contact hole 106. At this time, the resist 117*c* fills the contact hole 106 in such as manner that the surface of the resist 117*c* is lower than the surface of the interlayer insulating layer 112.

Next, FIG. 14 (*a*) shows the process for forming the line groove 108*a* which penetrates the interlayer insulating layer 112 and connects with the contact hole 106 and the variable resistance element. In this process, the line groove 108*a* is formed by dry etching the interlayer insulating layer 112 using the patterned hard mask 120'. At this time, the first line 101*a* on the bottom of the contact hole 106 is not dry etched as it is protected by the resist 117*c* filling the contact hole 106. However, the portions of the interlayer insulating layer 112 above the memory cell holes 103 are dry etched, and the first variable resistance layer 104*a* and the second variable resistance layer 104*b* are exposed to the bottom of the line groove 108*a*. At this time, it is preferable that the resist 117*c* be formed to protrude out from the bottom surface of the line groove 108*a* including the contact hole 106 (protrude out above the surface of the interlayer insulating layer 102 inside the line groove 108*a*). For example, it is preferable that the distance from the bottom surface of the line groove 108*a* including the contact hole 106 to the top surface of the protruding resist 117*c* be larger than the thickness of the current steering layer 111 (for example, no less than 10 nm and no more than 20 nm) to be formed in a later process. Next, the hard mask 120' can be completely removed while suppressing backward movement of the resist by etching using a halogen based gas, such as chlorine or hydrogen bromide.

With the above processes shown in FIG. 13A (c) through (d), FIG. 13B (a) through (b), and FIG. 14 (a), the photoresist pattern 131 for forming the contact hole 106 is formed above the interlayer insulating layer 112 and the hard mask 120'. Since the film thickness of the hard mask 120' is no more than 30 nm, degradation of the focus margin in the photolithography process for forming the photoresist pattern 131 is almost nonexistent, the focus margin can be enlarged to almost the same size as when the photolithography process is performed above the planarized interlayer insulating layer 112, and the fine and uniform dimensions of the contact hole 106 can be controlled. Moreover, the line groove 108a which opens the tops of the memory cell holes 103 can be formed while preventing the exposure of the first line 101a on the bottom of the contact hole 106 with the resist 117c.

Next, FIG. 14 (b) shows the process for forming the current steering layer 111 and 111a as the current steering layer of the MSM diode element above the interlayer insulating layer 102 and 112 so as to cover the exposed surface of the resist 117c and the inner surfaces of the line groove 108a. In this process, the current steering layer 111 and 111a comprising nitrogen-deficient silicon nitride film of the diode element are formed on the exposed surface of the resist 117c filling the contact hole 106, on the inner surfaces of the line groove 108a in which the first variable resistance layer 104a and the second variable resistance layer 104b are exposed, and on the surface of the interlayer insulating layer 112. Here, the current steering layer 111a is the current steering layer formed on the upper surface of the resist 117c protruding above the interlayer insulating layer 102. The nitrogen-deficient silicon nitride film is formed by a reactive sputtering process, that is to say, by sputtering a silicon target in a gas atmosphere of argon and nitrogen gas. The nitrogen content percentage is no less than 25 atm % and no more than 40 atm %.

Figure 16:
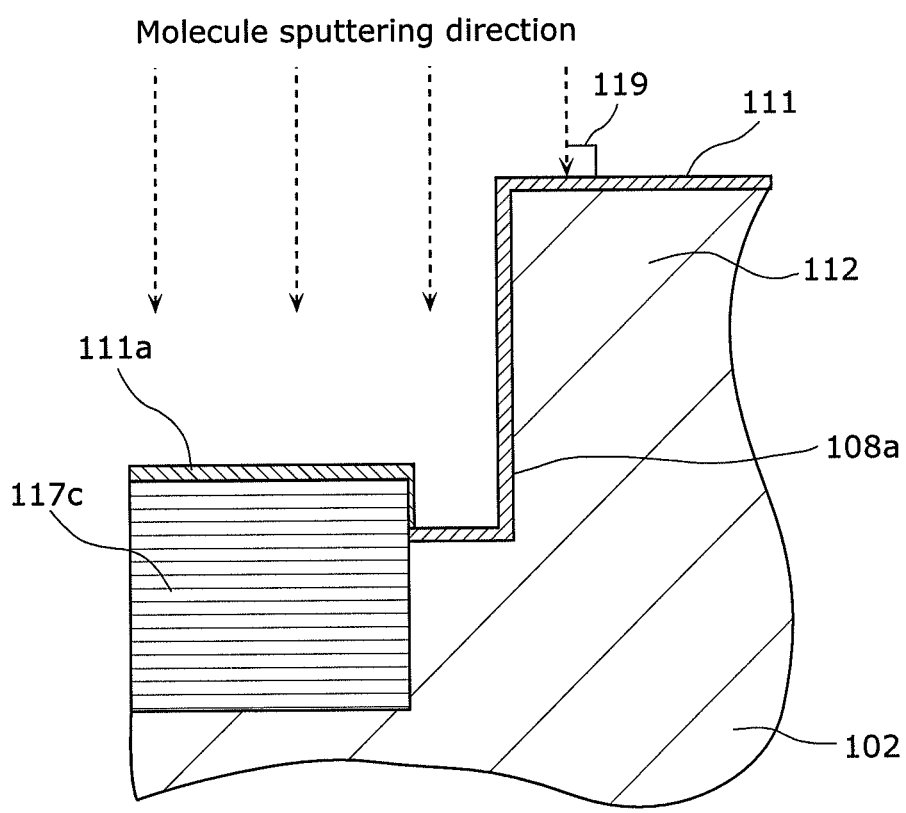
FIG. 16 is a cross-sectional view showing the relationship between the sputtering angle and used in the process for forming the current steering layer of the diode element and the film forming state of the current steering layer in the variable resistance nonvolatile memory device manufacturing method according to the second embodiment of the present invention.

In the process for forming the current steering layer 111 and 111a shown in FIG. 14 (b), the molecule sputtering direction, in other words the sputtering angle 119, is adjusted to be perpendicular to the surface of the interlayer insulating layer 112 (surface of the substrate 100), as FIG. 16 shows. In this case, the current steering layer 111a formed on the side walls of the protruding resist 117c is thinner than the current steering layer 111a formed on the top surface of the protruding resist 117c.

Figure 17:
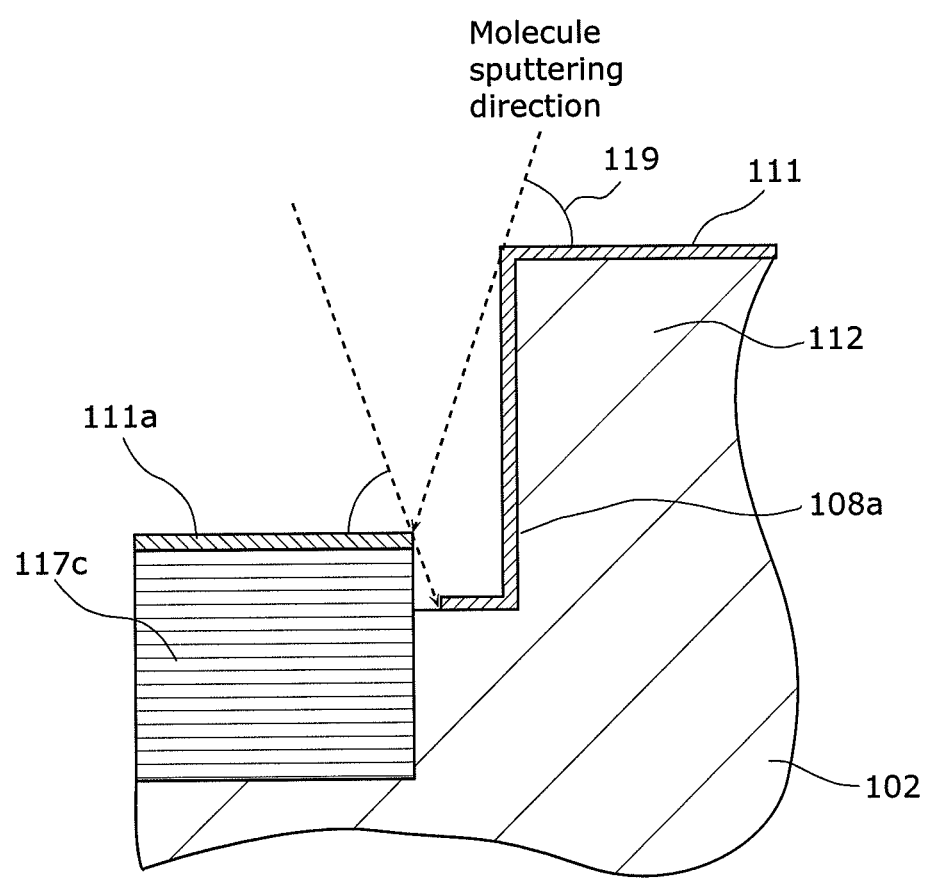
FIG. 17 is a cross-sectional view showing a variation of the relationship between the sputtering angle and used in the process for forming the current steering layer of the diode element and the film forming state of the current steering layer in the variable resistance nonvolatile memory device manufacturing method according to the second embodiment of the present invention.

It is to be noted that in the process for forming the current steering layer 111 and 111a shown in FIG. 14 (b), the angle 119 may be adjusted to be diagonal to the surface of the interlayer insulating layer 112 (surface of the substrate 100) so that the current steering layer 111 does not form on the side walls of the protruding resist 117c when the molecules are sputtered, as FIG. 17 shows. In this case, the sputtered molecules do not reach the side wall of the resist 117c shadowed by the interlayer insulating layer 112, and the region in which the current steering layer 111a is not deposited can be made to be the side wall of the protruding resist 117c and the surface of the interlayer insulating layer 102 between the resist 117c and the interlayer insulating layer 112. With this, in the process for removing the resist 117c shown in FIG. 14 (c), ashing from the side surface of the exposed resist 117c and complete lift-off of the current steering layer 111a above the resist 117c can be performed.

Figure 18:
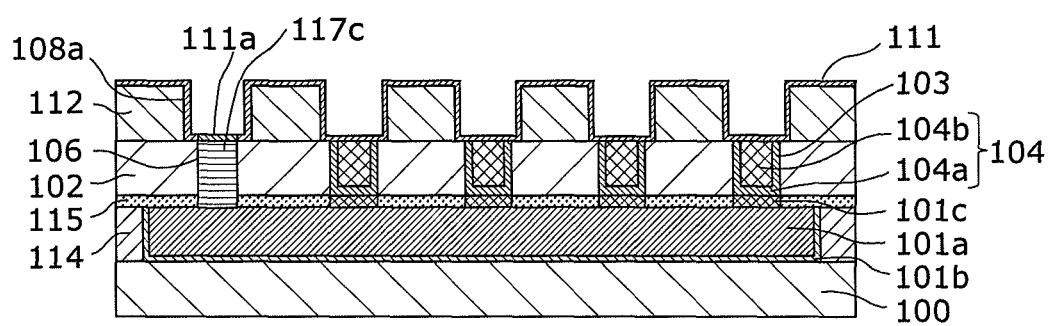
FIG. 18 is a cross-sectional view showing a variation of the main processes of the variable resistance nonvolatile memory device manufacturing method according to the second embodiment of the present invention.

Moreover, in the process for forming the resist 117c shown in FIG. 14 (a), when the resist 117c is formed so that the top surface thereof is flush with the interlayer insulating layer 102 at the bottom of the line groove 108a, the surface of the current steering layer 111 above the interlayer insulating layer 102 on the bottom of the line groove 108a and the surface of the current steering layer 111a above the resist 117c are planarized (become flush), as FIG. 18 shows.

Next, FIG. 14 (c) shows a process for lifting off the current steering layer 111a above the resist 117c filling the contact hole 106, by removing the resist 117c. In this process, the resist 117c filling the contact hole 106 is removed by ashing using oxygen gas, and at the same time, the current steering layer 111a formed above the resist 117c is lifted off along with the resist 117c.

It is to be noted that in the patterning of the interlayer insulating layer 102 and 112 shown in FIG. 13B (a), the etching may be stopped when the liner film 115 becomes exposed before the first line 101a is exposed in order to prevent the surface of the first line 101a from oxidizing and corroding. In this case, in the process shown in FIG. 14 (c), etching is performed to penetrate the liner film 115 and expose the first line 101a.

With the above processes shown in FIG. 14 (b) and FIG. 14 (c), the current steering layer 111 is formed as the current steering layer of the MSM diode element above the interlayer insulating layer 102 and 112 and the variable resistance layer 104 so as to cover the inner surfaces of the line groove 108a and not cover the bottom surface of the contact hole 106.

Next, FIG. 15 (a) through (c) show the process of forming the barrier film 109a and the second line 108. In this process, first the barrier film 109a and the line material, copper, are successively disposed using a sputtering method on all surfaces including above the first line 101a exposed to the bottom of the contact hole contact hole 106 and above the current steering layer 111 formed on the surface of the interlayer insulating layer 112 and the inner surface of the line groove 108a. In this case, it is preferable that the sputtering direction be approximately 90° with respect to the surface of the substrate 100 so the molecules reach the bottom surface of the contact hole 106. Next, all of the contact holes 106 and the line grooves 108a are filled with the second line 108 comprising the line material copper, by an electrolytic plating method using the deposited copper as the seed to further deposit copper (FIG. 15 (a)). Next, excess copper is removed from the surfaces of the interlayer insulating layer 112 and the second line 108 while also planarizing the surfaces by CMP in order to planarize (make flush) the surfaces of the interlayer insulating layer 112 and the second line 108 (FIG. 15 (b)). At this time, the portion of the barrier film 109a not inside the line groove 108a and the current steering layer 111 therebelow are removed at the same time to prevent leak current from occurring between a second line 108 in a different line groove 108a. Afterward, an SiN film having a thickness no less than 30 nm and no more than 200 nm is deposited above the planarized surfaces of the interlayer insulating layer 112 and the second line 108 using plasma CVD, for example, to form the liner film 116 covering the copper that is the second line 108 (FIG. 15 (c)).

Here, in FIG. 15 (b), the second line 108 and the barrier film 109a formed inside the contact hole 106 function as a contact plug. As such, with the manufacturing processes shown in FIG. 15 (a) through (c), by forming, in this order, the second line 108 including a lower layer functioning as the upper electrode of the MSM diode element and an upper layer comprising line material inside the contact hole 106 and the line groove 108a, the MSM diode element connected to the variable resistance element and the contact plug in the contact hole 106 are formed at the same time.

By using the above-described manufacturing method, it is possible to form the current steering layer 111 of the MSM diode element in the line groove 108a above the memory cell holes 103 without forming the current steering layer 111 of the MSM diode element on the bottom surface of the contact hole 106. This allows for the formation of the MSM diode element inside the line groove 108a above the memory cell holes 103 while also maintaining a low contact resistance between the first line 101a and the contact plug. Consequently, it is possible to realize a variable resistance nonvolatile memory device which enables large capacity and high integration through miniaturization.

In other words, in the process for forming the current steering layer 111 of the MSM diode element in the line groove 108a including the memory cell hole 103, it is possible to selectively not form the current steering layer 111 of the bidirectional diode element on the bottom surface of the contact hole 106 without using a removal process such as etching. This is possible due the filling of the contact hole 106 with resist in advance during the formation of the current steering layer of the bidirectional diode element. This makes it possible to make the contact resistance between the first line 101a and the contact plug ohmic and low while also forming the bidirectional diode in the line groove 108a above the memory cell hole 103. Consequently, it is possible to realize a variable resistance nonvolatile memory device which enables large capacity and high integration through miniaturization.

Moreover, it is also possible to form the line groove 108a after the formation of the contact hole 106, secure the focus margin in the lithography process for forming the contact hole 106, and accurately form a contact hole 106 having minute dimensions in the surface of the wafer. As a result, a variable resistance nonvolatile memory device which has good consistency with a dual damascene process that is suitable for the formation of fine copper lines can be achieved.

Third Embodiment

Figure 19A:
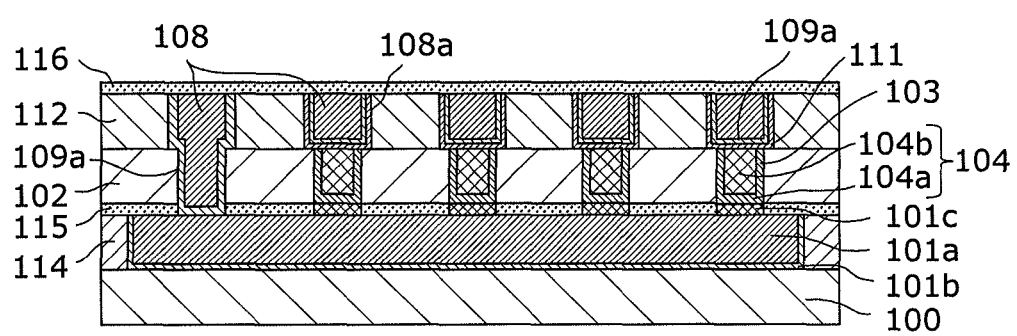
FIG. 19A is a cross-sectional view showing the variable resistance nonvolatile memory device according to an embodiment of the present invention.
Figure 19B:
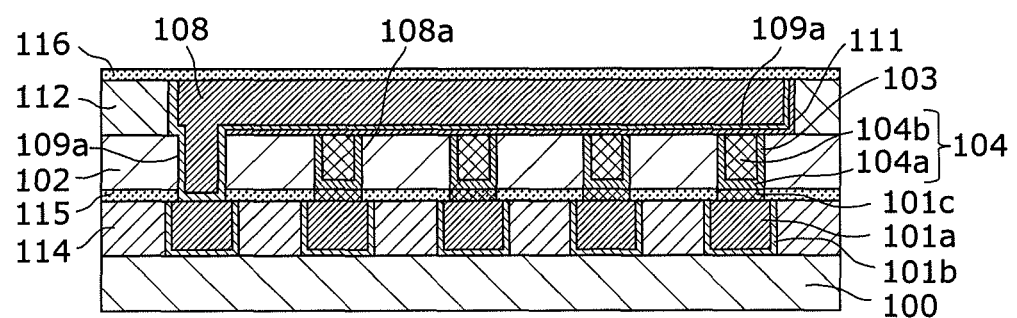
FIG. 19B is a cross-sectional view showing the variable resistance nonvolatile memory device according to an embodiment of the present invention.
Figure 20:
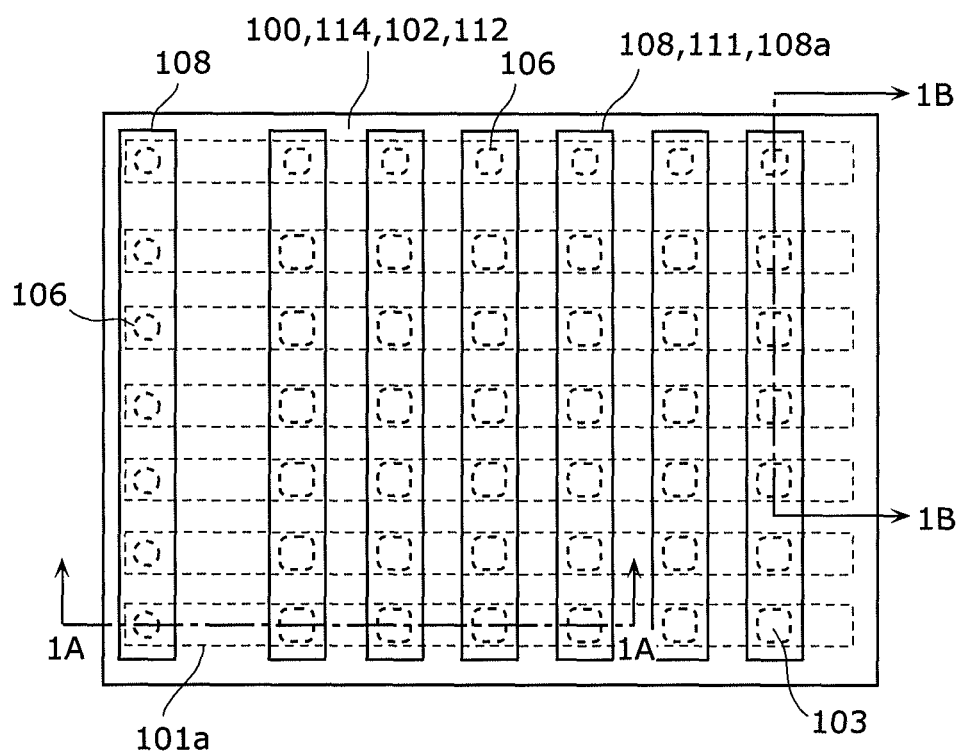
FIG. 20 is a plan view showing the variable resistance nonvolatile memory device according to an embodiment of the present invention.

FIG. 19A and FIG. 19B are cross-sectional views showing an example of a configuration of the variable resistance nonvolatile memory device according to the third embodiment of the present invention. FIG. 20 is a plan view showing an example of a configuration of the variable resistance nonvolatile memory device according to the third embodiment. It is to be noted that FIG. 19A is a cross-sectional view at the single dotted-and-dashed line labeled 1A-1A in FIG. 20 as viewed in the direction of the arrows, and FIG. 19B is a cross-sectional view at the single dotted-and-dashed line labeled 1B-1B in FIG. 20 as viewed in the direction of the arrows.

The configuration of this nonvolatile memory device (cross-point memory) is nearly the same as the cross-sectional view of the prior art shown in FIG. 25A and FIG. 25B and plan view shown in FIG. 26. The elements shown in FIG. 19A, FIG. 19B, and FIG. 20 share the same reference numerals as the elements shown in FIG. 25A, FIG. 25B, and FIG. 26 having essentially the same functions. The third embodiment is different from the prior art example in that the first electrode 101 disclosed in the prior art example is provided on a first line 101a as a first electrode 101c in the third embodiment. Moreover, in the prior art example, the second electrode 105 is provided separate from the second variable resistance layer 104b as a lower electrode of the MSM diode element. However, in the third embodiment, the second variable resistance layer 104b also performs as the lower electrode of the MSM diode element. Furthermore, the third embodiment is different in that it includes a liner film 115 and 116 which protect the lines and prevent the copper from oxidizing and such.

The plan view FIG. 20 shows the first lines 101a including a plurality of cross-point array lines aligned parallel to each other in a stripe pattern and lines for connecting the cross-point array lines to the surrounding circuit, and the second lines (lead-out lines) 108 including a plurality of cross-point array lines aligned parallel to each other in a stripe pattern and lines for connecting the cross-point array lines to the surrounding circuit. The memory cell hole 103 is formed at the cross point of the cross-point array line of the first line 101a and the cross-point array line of the second line 108. A plurality of the line grooves 108a are formed and the plurality of line grooves 108a extend in the same direction.

Figure 21:
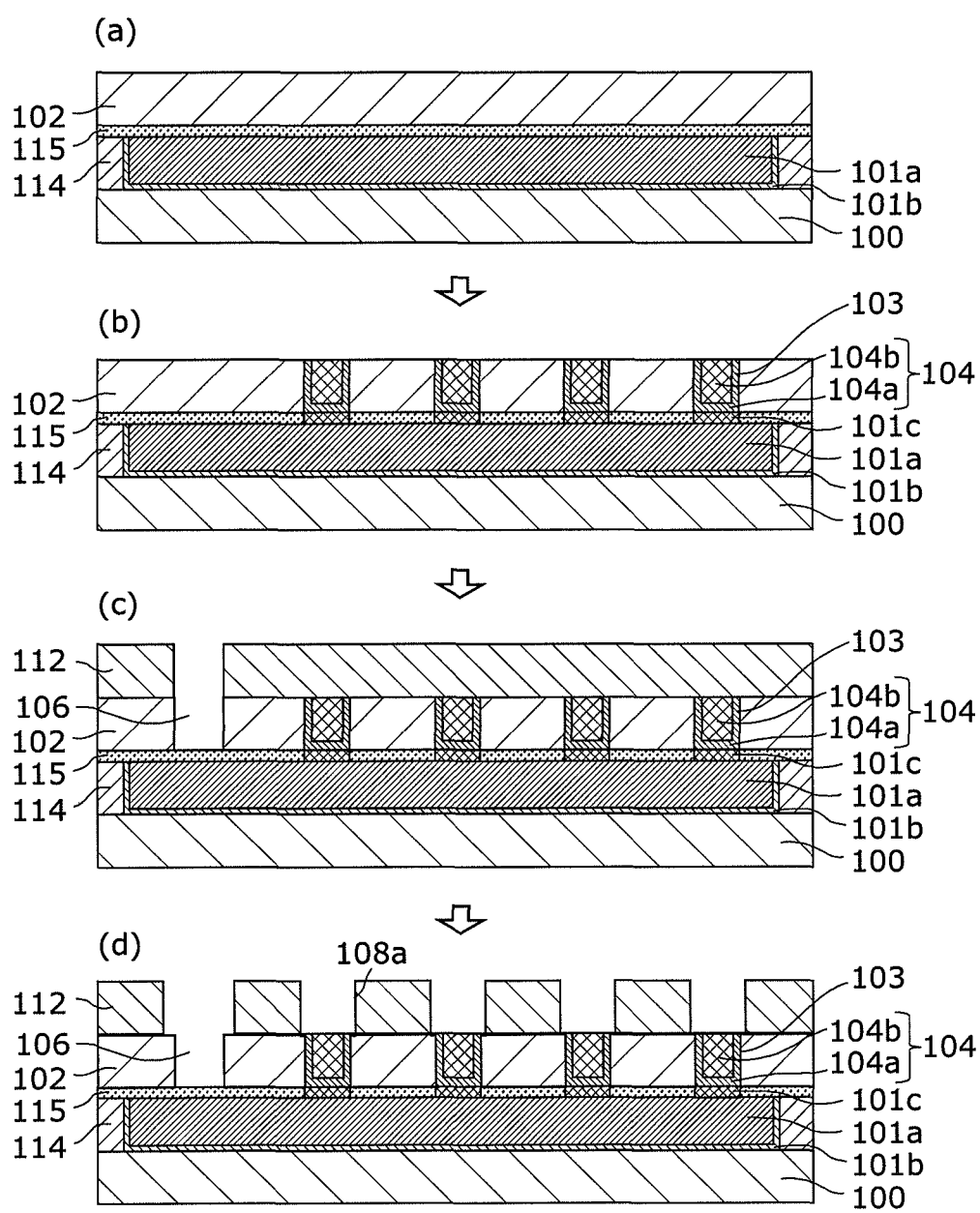
FIG. 21 is a cross-sectional view showing the main processes of the variable resistance nonvolatile memory device manufacturing method according to an embodiment of the present invention.
Figure 22:
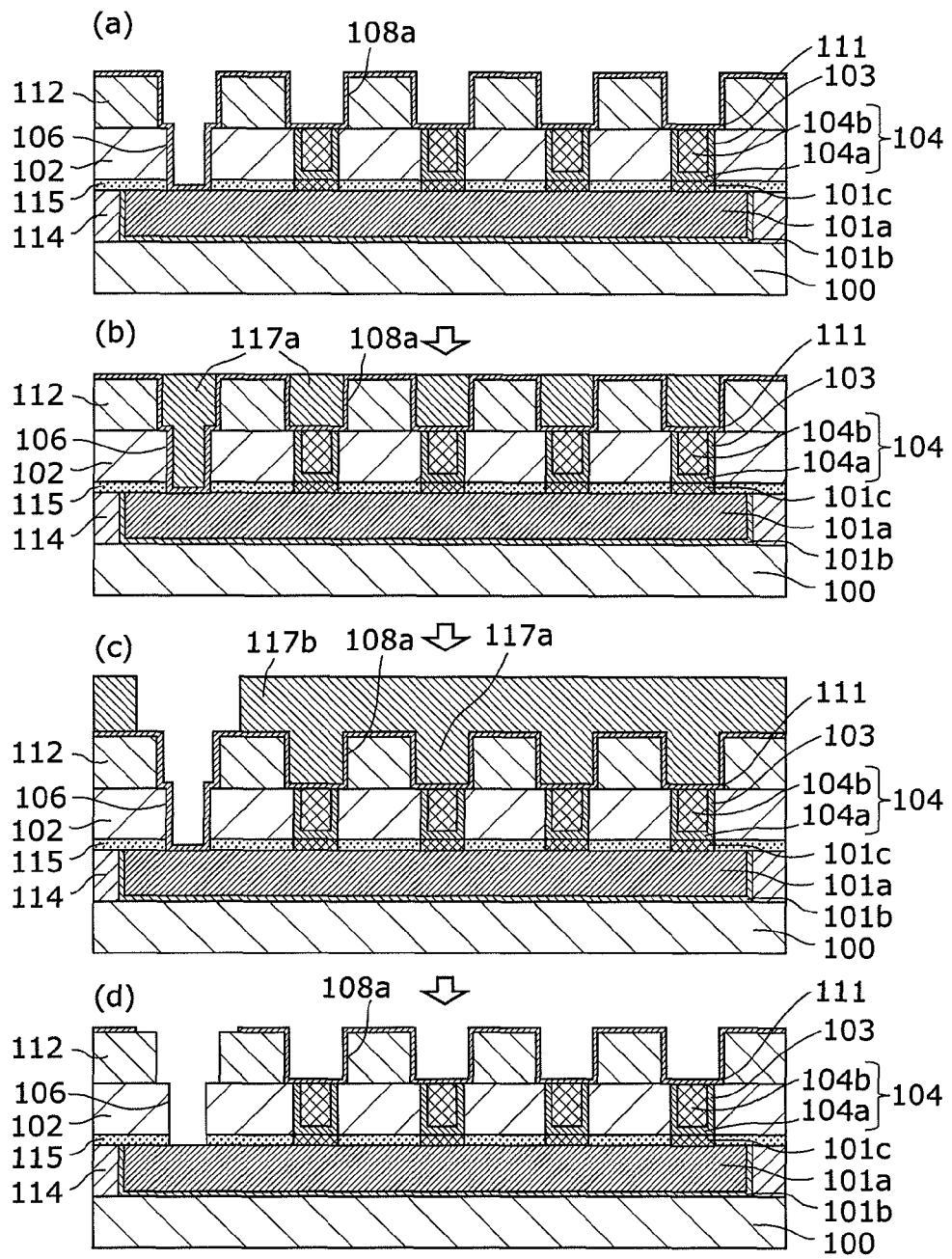
FIG. 22 is a cross-sectional view showing the main processes of the variable resistance nonvolatile memory device manufacturing method according to an embodiment of the present invention.
Figure 23:
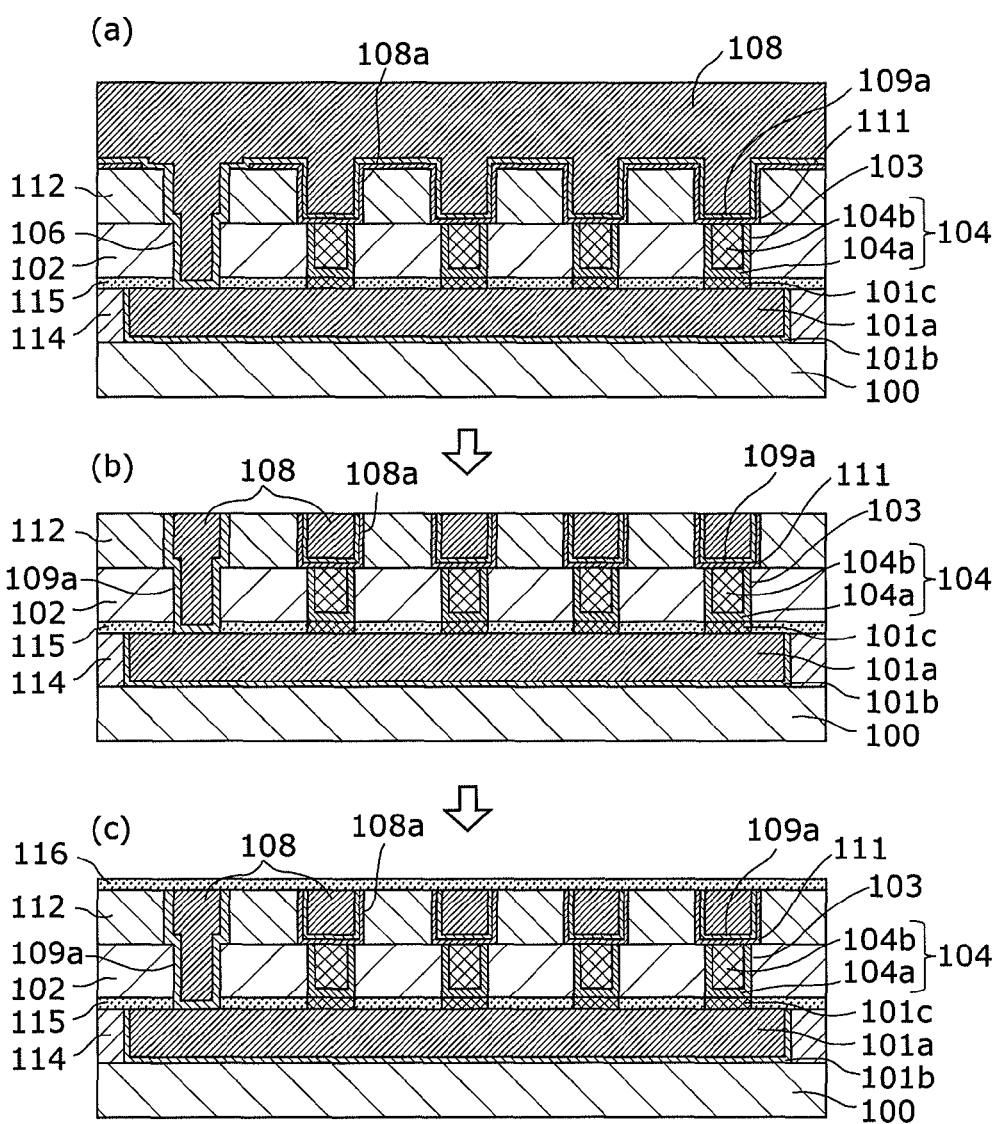
FIG. 23 is a cross-sectional view showing the main processes of the variable resistance nonvolatile memory device manufacturing method according to an embodiment of the present invention.

FIG. 21 (a) through FIG. 21 (d), FIG. 22 (a) through FIG. 22 (d), and FIG. 23 (a) through FIG. 23 (c) are cross-sectional views showing the main processes of the variable resistance nonvolatile memory device manufacturing method according to the third embodiment. The method of manufacturing will be discussed using each of these drawings.

First, FIG. 21 (a) shows the process for forming the first line 101a and the interlayer insulating layers 102 and 114. In this process, firstly, the interlayer insulating layer 114 comprising a silicon oxide film (for example, a plasma tetra ethyl ortho silicate (TEOS) film or a fluorinated silicate glass (FSG) film) is formed by, for example, plasma chemical vapor deposition (CVD) above the substrate 100 on which transistors and lower layer lines and such are formed. Next, the line groove to be filled with the first line 101a is formed in the interlayer insulating layer 114 by photolithography and dry etching. Next, the barrier film 101b comprising TaN (film thickness: no less than 5 nm and no more than 40 nm) and Ta (film thickness: no less than 5 nm and no more than 40 nm), and copper line material (film thickness: no less than 50 nm and no more than 300 nm) are successively deposited in the formed line groove by, for example, sputtering. Next, the first lines 101a are formed in a stripe pattern above the substrate 100 by filling all of the line grooves with the copper line material by further depositing copper with an electrolytic plating method using the deposited copper as the seed. Furthermore, a CMP process is used to remove excess copper from and planarize the surfaces of the interlayer insulating layer 114 and the first line 101a. Next, a SiN film having a thickness of approximately no less than 30 nm and no more than 200 nm is deposited by, for example, plasma CVD to cover the copper first line 101a, thereby forming the liner film 115. The interlayer insulating layer 102 is then further deposited on the liner film 115 (plurality of first lines 101a) as the first interlayer insulating layer, and if necessary, the surface of the interlayer insulating layer 102 is leveled by CMP.

FIG. 21 (b) shows the process for forming the memory cell hole 103 in the interlayer insulating layer 102 which penetrates the interlayer insulating layer 102 to connect to the first line 101a. In this process, firstly, an opening, which is the memory cell hole 103, is formed which penetrates the interlayer insulating layer 102 and the liner film 115 and electrically connects to the first line 101a. Next, the first electrode 101c comprising a noble metal and such is selectively formed only on the copper first line 101a on the bottom of the memory cell hole 103 by, for example, electroless plating. For example, Pt, Ir, and Pd and the like are grown to be no less than 2 nm and no more than 30 nm. Here, Pt is grown to be about 5 nm. At this time, a foundation plating layer comprising Ni and such may be grown between the copper and the noble metal. In this case, compared to when the foundation of the first electrode 101c is copper, the electroless plating is easier to control. Next, the first variable resistance layer 104a comprising tantalum oxide and such is formed by sputtering a tantalum target in a mixed gas atmosphere of argon and oxygen, in other words, by a reactive sputtering method, on the first electrode 101c on the bottom of the memory cell hole 103, on the side walls of the memory cell hole 103, and above the interlayer insulating layer 102. When using reactive sputtering, oxygen content atomic percentage can be increased by increasing the flow rate of oxygen at the time of deposition. Here, sputtering is performed at a power of 1.6 kW while flowing argon gas at 34 sccm and oxygen gas at 24 sccm to form the first variable resistance layer 104a having an oxygen content atomic percentage of approximately 72 atm %. Next, tantalum oxide for the second variable resistance layer 104b having a lower oxygen content atomic percentage than that of the first variable resistance layer 104a is formed inside the memory cell hole 103 on the surface of which the first variable resistance layer 104a is formed, that is to say, formed above the first variable resistance layer 104a formed inside the memory cell hole 103. This formation is performed by reactive sputtering at the same time the first variable resistance layer 104a is formed. Here, sputtering is performed at a power of 1.6 kW while flowing argon gas at 34 sccm and oxygen gas at 20.5 sccm to form the second variable resistance layer 104b having an oxygen content atomic percentage of approximately 65 atm %. In the formation of the second variable resistance layer 104b, sputtering is performed to deposit the tantalum oxide inside the memory cell hole 103 until the memory cell hole 103 is filled, then excess tantalum oxide above the surface of the interlayer insulating layer 102 is removed by CMP so that the first variable resistance layer 104a and the second variable resistance layer 104b, in other words the variable resistance layer 104, are only formed in the memory cell hole 103. With this, the memory cell hole 103 is filled with the variable resistance element.

It is conceivable that the resistance changing phenomenon occurs due to oxidation-reduction reactions of a transition metal which has a plurality of oxidation states. An oxidation-reduction reaction occurs in response to a voltage (or current) applied to the variable resistance layer. It is conceivable that when a voltage or current equal to or exceeding a threshold voltage or threshold current is applied to the variable resistance layer, an oxidation-reduction reaction occurs in the variable resistance layer causing the resistance to change. It is conceivable that by forming the variable resistance layer to have a stacked structure including a layer having a low level of oxygen deficiency (high resistance layer) and a layer having a high level of oxygen deficiency (low resistance layer), the majority of the voltage applied to the variable resistance layer is distributed to the high resistance layer causing a resistance changing phenomenon to occur therein in a stable manner. In this case, it is conceivable that the resistance of the entire high resistance layer does not change, but rather the resistance of a portion of the high resistance layer changes.

When the composition of first variable resistance layer 104a is $TaO_y$, it is preferable that y be no less than 2.1, and when the composition of the second variable resistance layer 104b is $TaO_x$, it is preferable that x be no less than 0.8 and no more than 1.9. When x and y are within these ranges, the resistance value of the variable resistance layer 104 can be changed in a rapid and stable manner. As such, it is preferable that x and y are within the above ranges.

To obtain a change in resistance value, the thickness of the variable resistance layer 104 is preferably no more than 1 μm. Furthermore, when the thickness of the variable resistance layer 104 is made to be no more than 200 nm, it is possible to facilitate the formation of the variable resistance layer 104 with a patterning process. Moreover, when the thickness of the variable resistance layer 104 is made to be no more than 200 nm, the voltage value of the pulse voltage required to change the resistance value of the variable resistance layer 104 can be reduced to a lower value. On the other hand, from the standpoint of more assuredly avoiding breakdown (insulation breakdown) upon application of the pulse voltage, the thickness of the variable resistance layer 104 is preferably no less than 5 nm.

Moreover, when the thickness of the first variable resistance layer 104a is too large inconveniences arise such as the initial resistance value becoming too large, and when the thickness is too small inconveniences arise such as inability to obtain a stable resistance change. In view of this, the thickness of the first variable resistance layer 104a is preferably no less than 1 nm and no more than 8 nm.

In the above process, after the memory cell hole 103 has be formed by patterning, the variable resistance layer (the first variable resistance layer 104a and the second variable resistance layer 104b) is deposited and formed on the entire surface of the wafer including inside the memory cell hole 103. Afterward, excess portions of the variable resistance layer outside of the memory cell hole 103 are removed by CMP to complete the patterning of the variable resistance layer. As a result, since an etching process is not required in the formation of the variable resistance layer, the variable resistance layer can be formed while in principle avoiding concerns associated with etching such as reactivity with etching gas, oxygen reduction damage, and charge damage. Here, since the second variable resistance layer 104b is a tantalum oxide having conductivity, it can also be used as the metal for the lower electrode of the MSM diode element.

Next, FIG. 21 (c) shows the process for forming the contact hole 106 in the interlayer insulating layer 102 and 112, which penetrates the interlayer insulating layer 102 and 112 and connects to the first line 101a, after the interlayer insulating layer 112 is formed as the second interlayer insulating layer above the surface of the interlayer insulating layer 102. In this process, after first further depositing the interlayer insulating layer 112 on the entire surface of the planarized wafer, the interlayer insulating layer 102 and 112 are patterned using a desired photomask to form an opening, in other words, the contact hole 106, for electrical connection with the first line 101a. In the patterning, etching is stopped when the liner film 115 becomes exposed, before the first line 101a is exposed. Doing so oxidizes the surface of the first line 101a thereby preventing the first line 101a from corroding.

Next, FIG. 21 (d) shows the process for forming, in the interlayer insulating layer 112, the line groove 108a which penetrates the interlayer insulating layer 112 and connects with the contact hole 106 and the variable resistance element. In this process, first a desired photomask comprising a photoresist and such for forming the line groove 108a to be filled with the second line (lead-out line) 108 and such is formed above the interlayer insulating layer 112, and the interlayer insulating layer 112 is patterned using this photomask. It is to be noted that the contact hole 106 may be filled with a photoresist (hereinafter also simply referred to as a resist) before forming the line groove 108a. Doing so ensures that the liner film 115 on the bottom of the contact hole 106 is protected, thereby ensuring that the first line 101a will not become exposed in the dry etching process for forming the line groove 108a. After forming the line groove 108a, the liner film 115 on the bottom of the contact hole 106 is opened. It is to be noted that when the contact hole 106 is filled with a resist, the liner film 115 on the bottom of the contact hole 106 is opened after removing the resist filling the contact hole 106 by ashing, for example. In FIG. 21 (d), the line groove 108a is formed so that the first variable resistance layer 104a and the second variable resistance layer 104b (which also functions as the lower electrode of the MSM diode element) are exposed at the bottom of the line groove 108a on top of the memory cell hole 103.

The processes shown in FIG. 21 (c) and FIG. 21 (d) makes it possible to increase the focus margin and control the fine and uniform dimensions of the contact hole 106 by forming the contact hole 106 by photolithography on the planarized interlayer insulating layer 112 first. In contrast, in the previously described prior art example, the focus margin is relatively smaller by no less than 100 nm and no more than 300 nm, approximately the depth of the line groove. Moreover, the top surface of the electrode layer included in the variable resistance element and the memory cell hole 103 filling the variable resistance layer can be opened, and the variable resistance layer in the memory cell hole 103 can be exposed while completely preventing the exposure of the first line 101a on the bottom of the contact hole 106.

Next, FIG. 22 (a) shows the process for forming the current steering layer 111 as the semiconductor layer of the MSM diode element above the interlayer insulating layer 102 and 112 and the variable resistance layer 104 so as to cover the inner surfaces (bottom surface and side surfaces) of the contact hole 106 and the line groove 108a. In this process, the current steering layer 111 comprising a nitrogen-deficient silicon nitride film is formed on all surfaces including inside the contact hole 106 and the line groove 108a in which the first variable resistance layer 104a and the second variable resistance layer 104b are exposed. The nitrogen-deficient silicon nitride film is formed by a reactive sputtering process, that is to say, by sputtering a silicon target in a gas atmosphere of argon and nitrogen gas. The nitrogen content percentage of the formed nitrogen-deficient silicon nitride film is no less than 25 atm % and no more than 40 atm %.

Next, FIG. 22 (b) shows the process for forming the resist so that the surface of the current steering layer 111 inside the contact hole 106, inside the line groove 108a above the contact hole 106, and inside the line groove 108a above the variable resistance layer 104 is covered. In this process, a resist 117a is applied on the entire surface above the current steering layer 111 comprising a nitrogen-deficient silicon nitride film, the resist etching is performed on the entire surface by ashing using oxygen gas, for example, and the resist 117a is selectively formed only in the contact hole 106 and the line groove 108a. At this time, the resist 117a is unexposed.

Next, FIG. 22 (c) shows the process for exposing the current steering layer 111 on the bottom of the contact hole 106 by selectively removing only the resist 117a that is inside the contact hole 106 and inside the line groove 108a that is above the contact hole 106 while leaving the resist 117a that is inside the line groove 108a that is above the variable resistance element (the variable resistance layer 104). In this process, a separate resist 117b is formed above the resist 117a while the resist 117a is in the filled and unexposed state, and photolithography is further performed on the resist 117a and 117b using a desired photomask to form the patterned resist 117a and 117b. At this time, in order to expose and removed only the resist 117a inside the contact hole 106 with an exposure process so that the resist 117a and 117b are formed above the variable resistance element, the photomask for the resist 117b and the resist 117a has a pattern which only exposes the current steering layer 111 of the MSM diode element inside the contact hole 106 while leaving the resist inside the line groove 108a.

Next, FIG. 22 (d) shows the process for exposing the first line 101a by selectively removing only the current steering layer 111 that is inside the contact hole 106 and above the line groove 108a that is above the contact hole while leaving the current steering layer 111 that is above the variable resistance element (variable resistance layer 104) to remain, and the process for removing the resist 117a and 117b. In this process, the surface of the first line 101a inside the contact hole 106 is exposed by selectively removing only the current steering layer 111 of the MSM diode element that is inside the contact hole 106 and that is above the line groove which is above the contact hole 106 by dry etching using the resist 117a and 117b in FIG. 22 (c) as a mask. Afterward, the resist 117a filling the line groove 108a and such and the resist 117b are removed by ashing, resulting in the configuration shown in FIG. 22 (d). At this time, it is possible to completely remove the current steering layer 111 inside the contact hole 106 by forming the resist 117a and 117b having a wider opening than the opening of the contact hole 106 while taking into account the positional margins in FIG. 22 (c).

With FIG. 22 (a) through (d), it is possible to form the current steering layer 111 of the bidirectional diode element above the interlayer insulating layer 102 and 112 and the variable resistance layer 104 so that the current steering layer 111 covers the line groove 108a and does not cover the bottom surface of the contact hole 106.

Next, FIG. 23 (a) through (c) show the process of forming the second line 108. In this process, first the barrier film 109a and copper for the seed layer are successively disposed using a sputtering method on all surfaces including above the first line 101a exposed to the bottom of the contact hole contact hole 106 and above the current steering layer 111 formed on the surface of the interlayer insulating layer 112 and the inner surface of the line groove 108a. In this case, it is preferable that the sputtering direction be such that the molecules are incident approximately vertical to the surface of the substrate 100 so the molecules reach the bottom surface of the contact hole 106. Next, all of the contact holes 106 and the line grooves 108a are filled with the second line 108 the line material copper, by an electrolytic plating method using the deposited copper as the seed layer to further deposit copper (FIG. 23 (a)). Next, excess copper is removed from the surfaces of the interlayer insulating layer 112 and the second line 108 while also planarizing the surfaces by CMP in order to planarize (make flush) the surfaces of the interlayer insulating layer 112 and the second line 108 (FIG. 23 (b)). At this time, the portion of the barrier film 109a not inside the line groove 108a and the current steering layer 111 therebelow are removed at the same time to prevent leak current from occurring between a second line 108 in a different line groove 108a. Afterward, an SiN film having a thickness no less than 30 nm and no more than 200 nm is deposited above the planarized surfaces of the interlayer insulating layer 112 and the second line 108 using plasma CVD, for example, to form the liner film 116 covering the copper that is the second line 108 (FIG. 23 (c)).

Here, in FIG. 23 (b), the second line 108 and the barrier film 109a formed inside the contact hole 106 and inside the line groove 108a above the contact hole 106 function as a contact plug. As a result, in the manufacturing processes shown in FIG. 23 (a) through (c), the MSM diode element connected to the variable resistance element and a contact plug for the contact hole 106 are formed by forming, inside the contact hole 106, inside the line groove 108a above the contact hole 106, and inside the line groove 108a above the variable resistance layer 104, the second line 108 including a lower layer which functions as the upper electrode of the MSM diode element and an upper layer comprising the line material.

By using the above-described manufacturing method, it is possible to selectively remove only the portion of the current steering layer 111 of the MSM diode element that is on the bottom of the contact hole 106 while leaving the current steering layer 111 of the MSM diode element to remain inside the line groove 108a that is above the memory cell holes 103. This allows for the formation of the MSM diode element inside the line groove 108a above the memory cell holes 103 while also maintaining a low contact resistance between the first line 101a and the contact plug. Consequently, it is possible to provide a variable resistance nonvolatile memory device in which large capacity and high integration are capable through miniaturization.

Moreover, it is also possible to form the line groove 108a subsequent to the formation of the contact hole 106, secure the focus margin in the lithography process for forming the contact hole 106, and accurately form a contact hole 106 having minute dimensions in the surface of the wafer. As a result, a variable resistance nonvolatile memory device which has good consistency with a dual damascene process that is suitable for the formation of fine copper lines can be achieved.

Figure 24A:
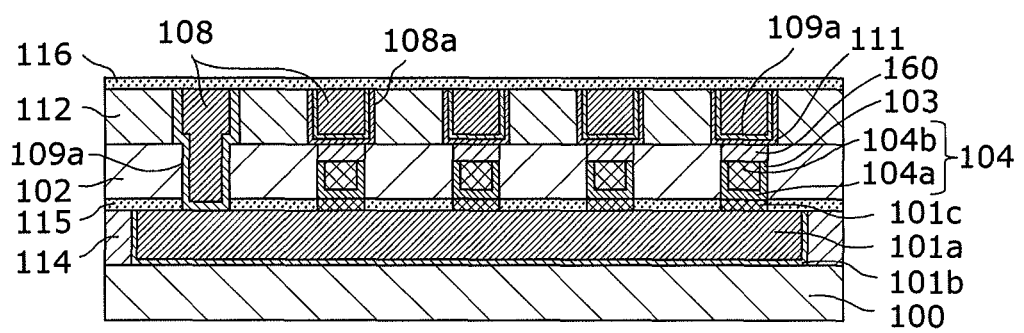
FIG. 24A is a cross-sectional view showing a variation of the variable resistance nonvolatile memory device according to an embodiment of the present invention.
Figure 24B:
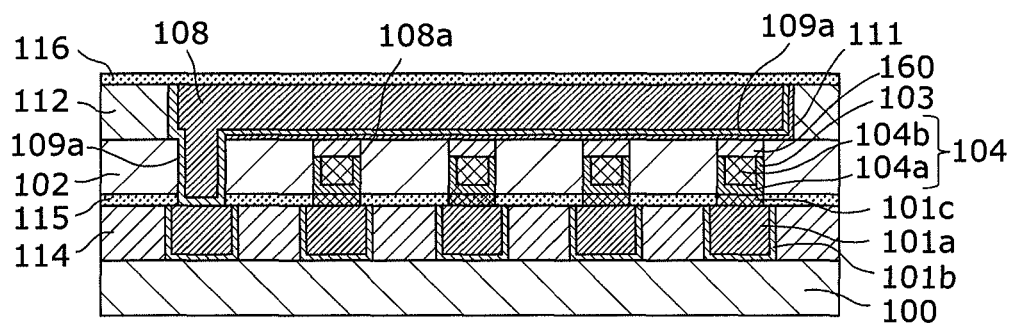
FIG. 24B is a cross-sectional view showing a variation of the variable resistance nonvolatile memory device according to an embodiment of the present invention.

Here, since the second variable resistance layer 104b is an oxygen-deficient tantalum oxide having conductivity, it can also be used as the metal for the lower electrode of the MSM diode element. Furthermore, the current steering layer 111 of the MSM diode element can also be used as the upper electrode of the variable resistance element including the first electrode 101c and the variable resistance layer 104, making it possible to use a structure which omits an intermediate electrode (a structure including the variable resistance element and the current steering element made up of four layers: the lower electrode of the variable resistance layer, the variable resistance layer, the semiconductor layer, and the upper electrode). However, it goes without saying that an intermediate electrode may be formed between the variable resistance layer 104 and the current steering layer 111. When the intermediate electrode has a low resistance value, it is preferable that the intermediate electrode be located so that it is isolated from between each variable resistance element from the standpoint of preventing cross talk between adjacent memory cells. As FIG. 24A and FIG. 24B show, it is possible to form an intermediate electrode 160 by first forming a recessed region in the upper portion of the memory cell hole 103 by causing the upper surfaces of the first variable resistance layer 104a and the second variable resistance layer 104b filled in the memory cell hole 103 to recede toward the substrate 100 by etching or over polishing by CMP, then depositing an intermediate electrode material (TaN, for example) and polishing off excess intermediate electrode by CMP so that material only remains in the recessed region in the upper portion of the memory cell hole 103.

The nonvolatile memory device manufacturing method according to the present invention has been described based on the embodiments, but the scope of the present invention is not intended to be limited thereto. The present invention also includes variations of the embodiment conceived by those skilled in the art unless they depart from the spirit and scope of the present invention. In other words, the manufacturing method may be any manufacturing method that includes at the least a process of filling at least the bottom of a contact hole, which is for contact for drawing each line included in the memory array (bit and word lines) out to external circuits, with a filling material so that a current steering layer is not formed on the bottom of the contact hole, and a process of removing the filling material after the formation of the current steering layer. Moreover, embodiments resulting from arbitrary combinations of constituent elements of different exemplary embodiments are intended to be included within the scope of the present invention as long as these do not depart from the essence of the present invention.

For example, the diode element is described as a MSM diode element in the above embodiments but is not limited thereto. For example, the diode element may be a MIM diode element as long as it is a bidirectional diode element.

Moreover, in the above embodiments, the relative positions of the first variable resistance layer 104a and the second variable resistance layer 104b may be reversed vertically in the stacked structure of the variable resistance element. In other words, the second variable resistance layer 104b may be formed above the first electrode 101c and the first variable resistance layer 104a may be formed thereabove.

Moreover, the method of manufacturing the nonvolatile memory device may further include filling the contact hole with a resist, wherein the forming of a current steering layer may include: forming the current steering layer above the first interlayer insulating layer and the second interlayer insulating layer to cover the resist and the line groove; and lifting off the current steering layer above the resist by removing the resist.

With this aspect, the line groove can be formed subsequent to the formation of the contact hole, the focus margin can be secured in the lithography process for forming the contact hole, and the contact hole having minute dimensions can be accurately formed in the wafer surface. As a result, a manufacturing method for a variable resistance nonvolatile memory device which has good consistency with a dual damascene process that is suitable for the formation of fine copper lines can be achieved.

Moreover, it is possible to, after formation of the contact hole and the line groove, without removing the resist filling the contact hole, form the current steering layer of the bidirectional diode element on top of said resist, then selectively remove, by lifting off at the time of resist removal, only the current steering layer of the bidirectional diode element formed above the resist. With this, the first line and the contact plug inside the contact hole are in contact via a barrier film having good adhesive properties and not the current steering layer of the bidirectional diode element. As a result, the contact resistance between the first line and the contact plug can be kept low, and at the same time, the bidirectional diode element can be formed in the line groove above the memory cell hole. Consequently, it is possible to realize a variable resistance nonvolatile memory device which enables large capacity and high integration.

Moreover, in the forming of a current steering layer, the current steering layer may be formed by sputtering a deposit material diagonally relative to a surface of the substrate to keep the current steering layer from being formed on a side wall of the resist that is protruding.

With this aspect, by adjusting the sputtering angle to be diagonal, the sputtered deposit material does not reach the side wall of the resist shadowed (blocked) by the side wall of the interlayer insulating layer formed by the line groove and a region can be formed on the side wall of the resist in which current steering layer is not formed. As a result, in the process of lifting off the current steering layer above the resist, it is possible to perform ashing on the exposed resist from the sides thereof, and accurately lift off the current steering layer above the resist.

Figure 24C:
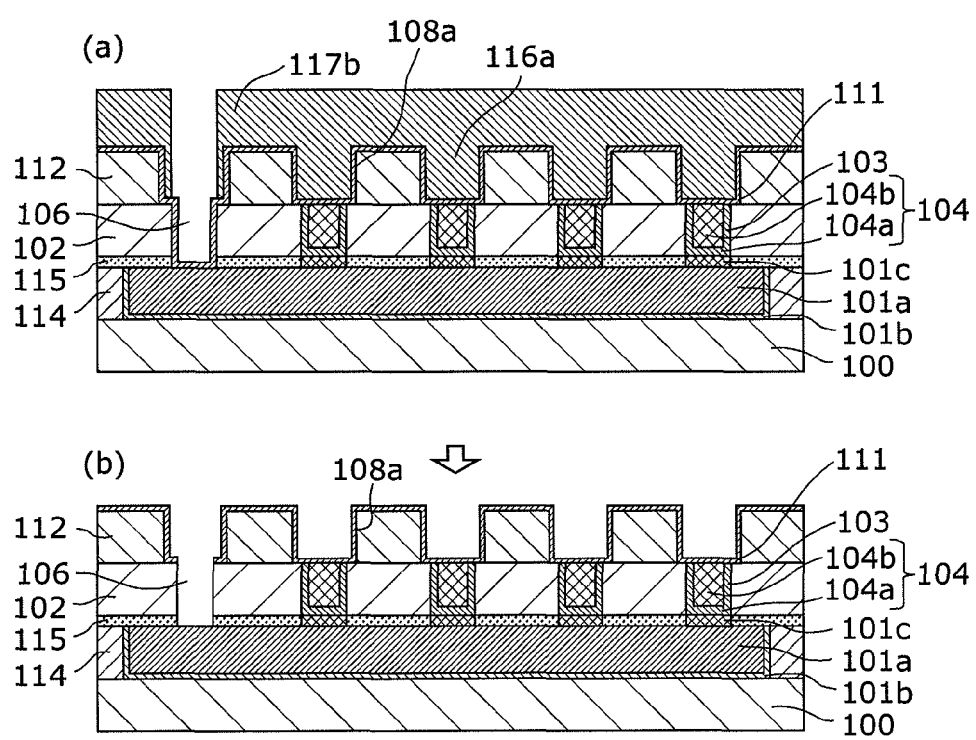
FIG. 24C is a cross-sectional view showing a variation of the main processes of the variable resistance nonvolatile memory device manufacturing method according to an embodiment of the present invention.

Moreover, in the above embodiments, the photomask used in the process for forming the resist 116a and 117b in FIG. 22 (c) may be the same photomask used when opening the contact hole 106 to reduce costs. In this case, as FIG. 24C (*a*) shows, the resist 116*a* and 117*b* are formed, and only the current steering layer 111 inside the contact hole 106 is selectively removed, as FIG. 24C (*b*) shows. This makes the end surface of the current steering layer 111 flush with the contact hole 106 side surface, whereby the width of the opening of the current steering layer 111 above the contact hole 106 and the width of the opening of the contact hole 106 are approximately equal.

INDUSTRIAL APPLICABILITY

The present invention is useful as a manufacturing method for large capacity nonvolatile memory devices, and particularly useful as a manufacturing method for storage or mixed memory in digital devices such as cellular phones.

REFERENCE SIGNS LIST 40 nonvolatile memory device
100 substrate
101, 101*c* first electrode
101*a* first line
101*b*, 109*a* barrier film
102, 112, 114 interlayer insulating layer
103 memory cell hole
104 variable resistance layer
104*a* first variable resistance layer
104*b* second variable resistance layer
105 second electrode
106 contact hole
106*a* opening
108 second line
108*a* line groove
109 third electrode
111, 111*a* current steering layer
115, 116 liner film
116*a*, 117*a*, 117*b*, resist
117*c* resist
119 angle
120 hard mask layer
120' hard mask
128 lead-out line
130 photoresist layer
131 photoresist pattern
150 copper
160 intermediate electrode

The invention claimed is:

1. A method of manufacturing a nonvolatile memory device that is a variable resistance nonvolatile memory device, the method comprising:
   forming a plurality of first lines in a stripe pattern above a substrate;
   forming a first interlayer insulating layer above the first lines;
   forming a plurality of memory cell holes, each of which penetrates the first interlayer insulating layer and connects to one of the first lines;
   filling each of the memory cell holes with at least one electrode of a variable resistance element and a variable resistance layer of the variable resistance element;
   forming a second interlayer insulating layer above the first interlayer insulating layer, followed by forming a contact hole which penetrates the first interlayer insulating layer and the second interlayer insulating layer and connects to one of the first lines;
   forming a line groove which penetrates the second interlayer insulating layer, connects to the contact hole and the memory cell holes which are aligned, and extends in an alignment direction of the contact hole and the memory cell holes;
   forming a current steering layer of a bidirectional diode element above the first interlayer insulating layer, the second interlayer insulating layer, and the variable resistance layer to cover the line groove without covering a bottom surface of the contact hole; and
   forming (i) the bidirectional diode element which is connected to the variable resistance element and (ii) a contact plug for the contact hole by forming a second line inside the contact hole and the line groove, the second line including a lower layer which functions as an upper electrode of the bidirectional diode element and an upper layer comprising a line material,
   wherein in the forming of a current steering layer, the current steering layer is formed by sputtering a deposit material diagonally relative to a surface of the substrate in a direction parallel to an extending direction of the memory cell holes.

2. The method of manufacturing a nonvolatile memory device according to claim 1,
   wherein in the forming of a line groove, the line groove is formed to connect to the memory cell holes aligned in the extending direction of the line groove.

3. The method of manufacturing a nonvolatile memory device according to claim 2,
   wherein when: a is a size of an opening of the contact hole in the extending direction; e is a distance in the extending direction from an end of an opening of the line groove to an end of an opening of a closest one of the memory cell holes that is closest to the end of the opening of the line groove; c is a height of the contact hole; and d is a height of the line groove,
   the a and the e are values measured in a same direction and cross section for (i) the contact hole and the memory cell holes that are aligned in the extending direction and (ii) the line groove which includes openings of the contact hole and the memory cell holes, and
   using the a, the c, the d, and the e, α is defined by α=tan$^{-1}$ (c/a) and γ is defined by γ=tan$^{-1}$ (d/e),
   the line groove, the contact hole, and all of the memory cell holes are formed to satisfy α>γ.

4. The method of manufacturing a nonvolatile memory device according to claim 3,
   wherein when the contact hole is positioned in the extending direction between one of the memory cell holes closest to the end of the opening of the line groove and the end of the opening of the line groove,
   b is a distance from an end of the opening of the contact hole furthest from the end of the opening of the line groove to the end of the opening of the line groove,
   the a and the b are values measured in the same direction and cross section for (i) the contact hole and the memory cell holes that are aligned in the extending direction and (ii) the line groove which includes openings of the contact hole and the memory cell holes, and
   using the b, the c, and the d, β is defined by β=tan$^{-1}$ {(c+d)/b},
   the line groove and the contact hole are formed to satisfy β>α.

5. The method of manufacturing a nonvolatile memory device according to claim 3,
   wherein a sputtering direction of the deposit material has an angle θ relative to the surface of the substrate and is a direction that is parallel to the cross section in which the a and the e are measured, and the angle θ, the α, and the γ satisfy γ<θ<α.

6. The method of manufacturing a nonvolatile memory device according to claim 4, wherein a sputtering direction of the deposit material has an angle θ relative to the surface of the substrate, is a direction that is parallel to the cross section in which the a, the b, and the e are measured, and is a direction from the end of the opening of the line groove toward the contact hole, and the angle θ, the α, and the γ satisfy γ<θ<γ.

7. The method of manufacturing a nonvolatile memory device according to claim 2, wherein a sputtering direction of the deposit material is a direction parallel to the alignment direction of the memory cell holes when the surface of the substrate is viewed from a vertical direction.

8. The method of manufacturing a nonvolatile memory device according to claim 1, wherein the line groove includes a plurality of line grooves, and the line grooves extend in a same direction.

9. The method of manufacturing a nonvolatile memory device according to claim 1, further comprising filling the contact hole with a resist, wherein the forming of a current steering layer includes:

forming the current steering layer above the first interlayer insulating layer and the second interlayer insulating layer to cover the resist and the line groove; and lifting off the current steering layer above the resist by removing the resist.

10. The method of manufacturing a nonvolatile memory device according to claim 9, wherein in the forming of a current steering layer, the resist protrudes out from a bottom surface of the line groove including an opening of the contact hole.

11. The method of manufacturing a nonvolatile memory device according to claim 10, wherein a distance from the bottom surface of the line groove including the opening of the contact hole to a top surface of the resist that is protruding is greater than a film thickness of the current steering layer.

12. The method of manufacturing a nonvolatile memory device according to claim 10, wherein in the forming of a current steering layer, the current steering layer is formed by sputtering a deposit material diagonally relative to a surface of the substrate to keep the current steering layer from being formed on a side wall of the resist that is protruding.

* * * * *